(12) United States Patent
Kaida et al.

(10) Patent No.: US 12,013,416 B2
(45) Date of Patent: Jun. 18, 2024

(54) CONTACT TERMINAL, INSPECTION JIG, AND INSPECTION DEVICE

(71) Applicant: NIDEC READ CORPORATION, Kyoto (JP)

(72) Inventors: Michio Kaida, Kyoto (JP); Norihiro Ota, Kyoto (JP); Yusuke Yokota, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 259 days.

(21) Appl. No.: 17/598,918

(22) PCT Filed: Mar. 12, 2020

(86) PCT No.: PCT/JP2020/010931
§ 371 (c)(1),
(2) Date: Sep. 28, 2021

(87) PCT Pub. No.: WO2020/203154
PCT Pub. Date: Oct. 8, 2020

(65) Prior Publication Data
US 2022/0155346 A1    May 19, 2022

(30) Foreign Application Priority Data

Mar. 29, 2019  (JP) .................................. 2019-069272

(51) Int. Cl.
*G01R 1/073*     (2006.01)
*G01R 31/28*     (2006.01)

(52) U.S. Cl.
CPC ..... *G01R 1/07342* (2013.01); *G01R 31/2818* (2013.01)

(58) Field of Classification Search
CPC ............ G01R 1/07342; G01R 1/06722; G01R 31/2818
See application file for complete search history.

(56) References Cited

U.S. PATENT DOCUMENTS

| | | | |
|---|---|---|---|
| 2010/0007365 A1* | 1/2010 | Ishizuka | ............ H01R 13/2421 324/755.05 |
| 2010/0123476 A1 | 5/2010 | Kazama et al. | |
| 2012/0264318 A1 | 10/2012 | Ishikawa | |
| 2015/0247882 A1 | 9/2015 | Lee et al. | |

(Continued)

FOREIGN PATENT DOCUMENTS

| | | |
|---|---|---|
| JP | 2014092539 A | 5/2014 |
| JP | 2016075709 A | 5/2016 |
| JP | 2017146119 A | 8/2017 |

*Primary Examiner* — Dominic E Hawkins
(74) *Attorney, Agent, or Firm* — VIERING, JENTSCHURA & PARTNER MBB

(57) ABSTRACT

In a contact terminal, the first insertion portion includes a first contact portion having a first flat surface along an axial direction, the second insertion portion includes a second contact portion having a second flat surface along the axial direction, the first flat surface and the second flat surface are in contact with each other, the tubular body includes at least one of a first end side notch provided along the axial direction on a peripheral surface of the one end portion in the axial direction of the tubular body and a second end side notch provided along the axial direction on a peripheral surface of the other end portion in the axial direction of the tubular body.

20 Claims, 19 Drawing Sheets

(56) References Cited

U.S. PATENT DOCUMENTS

| | | |
|---|---|---|
| 2017/0229802 A1 | 8/2017 | Kazama et al. |
| 2019/0011479 A1 | 1/2019 | Ota |
| 2019/0178910 A1 | 6/2019 | Ota |
| 2022/0416462 A1* | 12/2022 | Hirano ............... H01R 13/2421 |

* cited by examiner

CONTACT TERMINAL, INSPECTION JIG, AND INSPECTION DEVICE

CROSS-REFERENCE TO RELATED APPLICATIONS

This application is a U.S. National Stage Application, filed under 35 U.S.C. § 371, of International Patent Application No. PCT/JP2020/010931, filed on Mar. 12, 2020, and claims priority under 35 U.S.C. § 119(a) and 35 U.S.C. § 365(b) from Japanese Patent Application No. 2019-069272, filed on Mar. 29, 2019; the disclosures of which are incorporated herein by reference.

FIELD

Various embodiments of the present disclosure relate to a contact terminal used for inspection of an inspection target.

BACKGROUND

Conventionally, a contact terminal to be brought into contact with an inspection target is known.

The contact terminal, which is conventionally known, includes a tubular body, a first central conductor, and a second central conductor. The tubular body is formed in a cylindrical shape by a material having conductivity. The tubular body is formed with a first spring portion and a second spring portion that extend and contract in the axial direction of the tubular body. A joining portion that connects the first spring portion and the second spring portion is provided at a central portion of the tubular body in the axial direction.

The first central conductor and the second central conductor are made of a conductive material and formed in a rod shape. A first swell portion is provided at the tip of the first central conductor. The first swell portion is disposed in the joining portion in a state where the first central conductor is fixed to one end portion of the tubular body. A second swell portion is provided at the tip of the second central conductor. The second swell portion is disposed in the joining portion in a state where the second central conductor is fixed to the other end portion of the tubular body.

When a base plate is attached to a support member that supports the contact terminal having the above configuration, one end portion of the first central conductor is brought into pressure contact with the electrode of the base plate according to a biasing force of the first spring portion and the second spring portion, and the one end portion of the first central conductor and the electrode are held in a conductive contact state.

When the inspection target is inspected using the contact terminal, the other end portion of the second central conductor is brought into pressure contact with the inspection target point of the inspection target according to the biasing force of the first spring portion and the second spring portion, and the other end portion of the second central conductor and the inspection target point are held in the conductive contact state.

As a result, a contact point is formed by contact between the inspection target and the other end portion of the second central conductor, contact between the second swell portion and the joining portion, contact between the joining portion and the first swell portion, and contact between the one end portion of the first central conductor and the electrode, and a current path is formed.

However, in the conventional contact terminal, two contact points are formed as contact points inside the contact terminal, that is, a contact point between the second swell portion and the joining portion and a contact between the joining portion and the first swell portion, and thus there is room for improving the electric resistance of a current path.

SUMMARY

An exemplary contact terminal of the present disclosure includes: a tubular body extending in an axial direction of the contact terminal; and a bar-shaped first conductor and a bar-shaped second conductor having conductivity. The first conductor includes: a first protrusion that protrudes from the tubular body toward one side in the axial direction; and a first insertion portion disposed inside an outer periphery of the tubular body and fixed to one end portion of the tubular body in the axial direction. The second conductor includes a second insertion portion that is disposed inside an outer periphery of the tubular body on the other side in the axial direction and is fixed to the other end portion of the tubular body in the axial direction. The tubular body includes a spring portion formed in a spiral shape along a peripheral surface of the tubular body. The first insertion portion includes a first contact portion having a first flat surface along the axial direction. The second insertion portion includes a second contact portion having a second flat surface along the axial direction. The first flat surface and the second flat surface are in contact with each other. The tubular body includes at least one of a first end side notch provided along the axial direction on a peripheral surface of the one end portion of the tubular body in the axial direction and a second end side notch provided along the axial direction on a peripheral surface of the other end portion of the tubular body in the axial direction. In a case where the first end side notch is provided, the first insertion portion includes a first end side rib disposed between circumferential end surfaces of the first end side notch. In a case where the second end side notch is provided, the second insertion portion includes a second end side rib disposed between circumferential end surfaces of the second end side notch.

The above and other elements, features, steps, characteristics and advantages of the present disclosure will become more apparent from the following detailed description of the preferred embodiments with reference to the attached drawings.

BRIEF DESCRIPTION OF THE DRAWINGS

In the drawings, like reference characters generally refer to the same parts throughout the different views. In the drawings, components given the same reference numerals denote the same components, and description thereof will be omitted. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
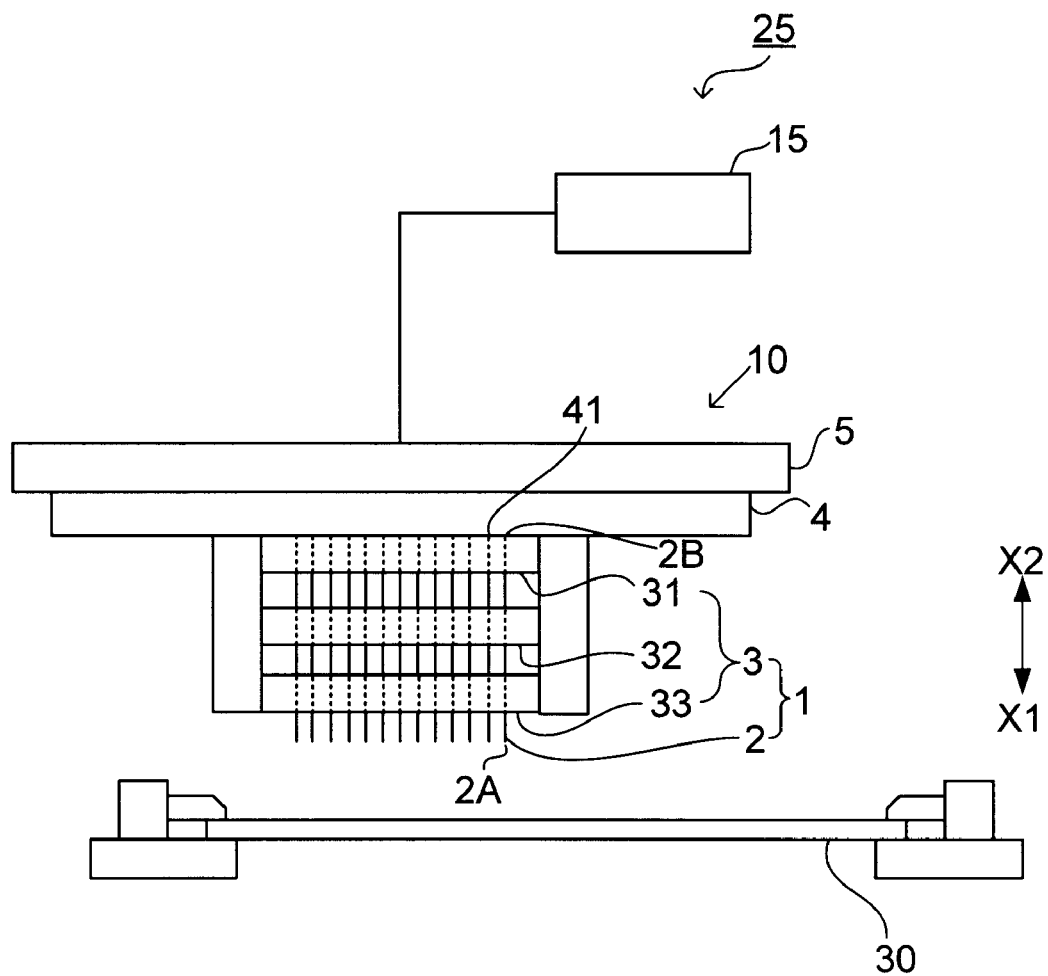
FIG. 1 is a schematic diagram illustrating an overall configuration of an inspection device according to an exemplary embodiment of the present disclosure.

Hereinafter, exemplary embodiments of the present disclosure will be described with reference to the drawings. In the following, a direction parallel to a central axis J (see FIGS. 5A and 6) of a contact terminal is defined as an "axial direction". In the drawings, "X1" represents a first side in the axial direction and "X2" represents a second side in the axial direction. In addition, a direction about the central axis J will be referred to as a "circumferential direction".

FIG. 1 is a schematic diagram illustrating an overall configuration of an inspection device according to an exemplary embodiment of the present disclosure. It should be noted in FIG. 1 that one axial direction X1 side corresponds to a lower side and the other axial direction X2 side corresponds to an upper side.

The inspection device 25 illustrated in FIG. 1 electrically inspects an inspection target 30. The inspection device 25 includes an inspection jig 10 and an inspection processing unit 15. The inspection jig 10 is configured as, for example, a so-called probe card.

The inspection target 30 is, for example, a semiconductor wafer in which a plurality of circuits is formed on a semiconductor substrate such as silicon. The semiconductor wafer is diced to be divided into semiconductor chips having the individual circuits. In addition to the semiconductor wafer, the inspection target 30 can be, for example, a semiconductor chip, a chip size package (CSP), or an electronic component such as a semiconductor element.

In addition, the inspection target 30 may be a substrate. In this case, the inspection target 30 may be, for example, a board such as a printed circuit board, a glass epoxy board, a flexible board, a ceramic multilayer circuit board, a package board for a semiconductor package, an interposer board, or a film carrier. The inspection target 30 may alternatively be an electrode plate for a display such as a liquid crystal display, an electro-luminescence (EL) display, or a touch screen display or an electrode plate for a touch screen.

The inspection target 30 may alternatively be a product obtained by packaging technology called embedded multi-die interconnect bridge (EMIB). According to EMIB, a small silicon substrate called a silicon bridge is embedded in a package resin board, and fine wires are formed on a surface of the silicon bridge in high density, so that adjacent silicon dies are mounted on the package resin board in proximity to each other.

As illustrated in FIG. 1, the inspection jig 10 includes a probe head 1, a pitch conversion unit 4, and a connection plate 5. The probe head 1 includes a contact terminal (probe) 2 and a support member 3.

The support member 3 supports a plurality of contact terminals 2 formed in a rod shape. That is, the inspection jig 10 includes the plurality of contact terminals 2 and the support member 3 that supports the plurality of contact terminals 2.

The pitch conversion unit 4 is disposed above the support member 3 and fixed to the support member 3. The contact terminal 2 has one end portion 2A on the one axial direction X1 side and the other end portion 2B on the other axial direction X2 side. The other end portion 2B is connected to each of the first electrodes 41 provided at the lower end portion of the pitch conversion unit 4.

Each of the first electrodes 41 is electrically connected to each of the second electrodes formed at the upper end portion of the pitch conversion unit 4 via a wiring portion (not illustrated) formed inside the pitch conversion unit 4. The pitch conversion unit 4 converts a first pitch between the contact terminals 2 into a second pitch between the second electrodes. The second pitch is longer than the first pitch.

The connection plate 5 is configured such that the pitch conversion unit 4 is detachable. A plurality of electrodes (not illustrated) connected to the second electrode is formed on the connection plate 5. Each of the electrodes of the connection plate 5 is electrically connected to the inspection processing unit 15 by, for example, a cable, a connection terminal, or the like (not illustrated).

The inspection processing unit 15 includes, for example, a power supply circuit, a voltmeter, an ammeter, a microcomputer, and so on. The inspection processing unit 15 controls a drive mechanism (not illustrated) to move the inspection jig 10.

In a case where the inspection target 30 is, for example, a semiconductor wafer, inspection points such as pads or bumps are formed for each circuit corresponding to an individual semiconductor chip to be obtained by dicing the inspection target 30. The inspection processing unit 15 defines a certain region of the plurality of circuits on the inspection target 30 as an inspection region, and moves the inspection jig 10 to a position at which the contact terminals 2 located above are opposite the inspection points located below in the inspection region. At this time, the one end portions 2A of the contact terminals 2 of the inspection jig 10 are directed toward the inspection target 30.

Then, the inspection processing unit 15 moves the inspection jig 10 downward to bring the contact terminal 2 into contact with each inspection point in the inspection region. In this manner, the inspection points and the inspection processing unit 15 are electrically connected.

The inspection processing unit 15 supplies a current or a voltage for inspection to each inspection point of the inspection target 30 via each contact terminal 2 in the above-described state, and executes inspection of the inspection target 30 such as disconnection or short circuit of a circuit pattern based on a voltage signal or a current signal obtained from each contact terminal 2. Alternatively, the inspection processing unit 15 may measure an impedance of the inspection target 30 based on the voltage signal or the current signal obtained from each contact terminal 2 by supplying AC current or voltage to the inspection points.

That is, the inspection device 25 includes the inspection jig 10 and the inspection processing unit 15 that performs inspection of the inspection target 30 based on the electrical signal obtained by bringing the contact terminal 2 into contact with the inspection point provided in the inspection target 30.

When the inspection in the inspection region of the inspection target 30 is completed, the inspection processing unit 15 moves the inspection jig 10 upward, translates the inspection jig 10 to a position corresponding to the new inspection region, moves the inspection jig 10 downward, and brings the contact terminal 2 into contact with each inspection point in the new inspection region to perform the inspection. In this manner, the entire inspection target 30 is inspected by performing the inspection while sequentially changing the inspection region.

The position of the inspection jig 10 may be fixed, and the inspection target 30 may be moved with respect to the inspection jig 10.

Figure 2:
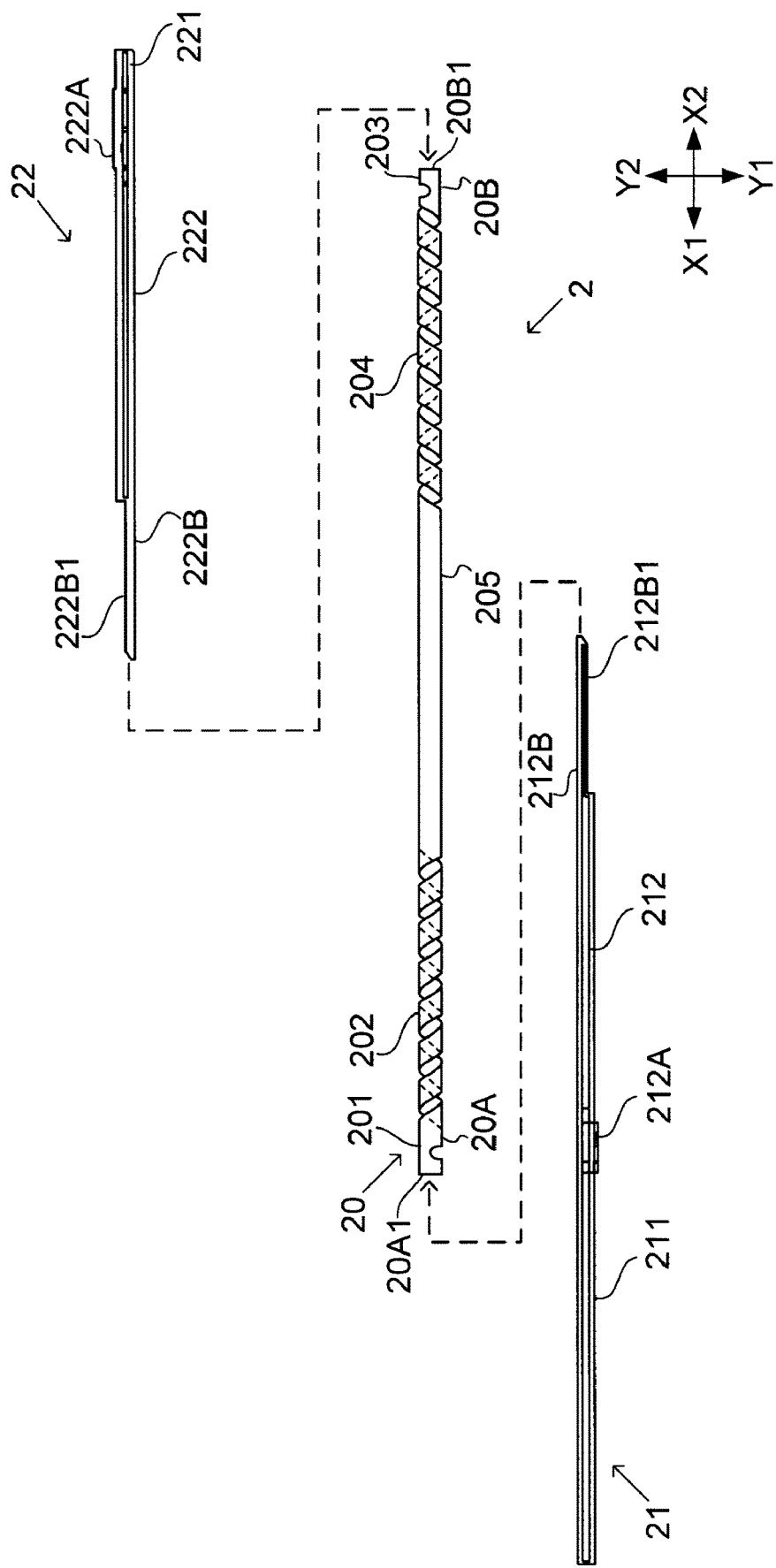
FIG. 2 is an exploded side view illustrating a contact terminal.
Figure 3:
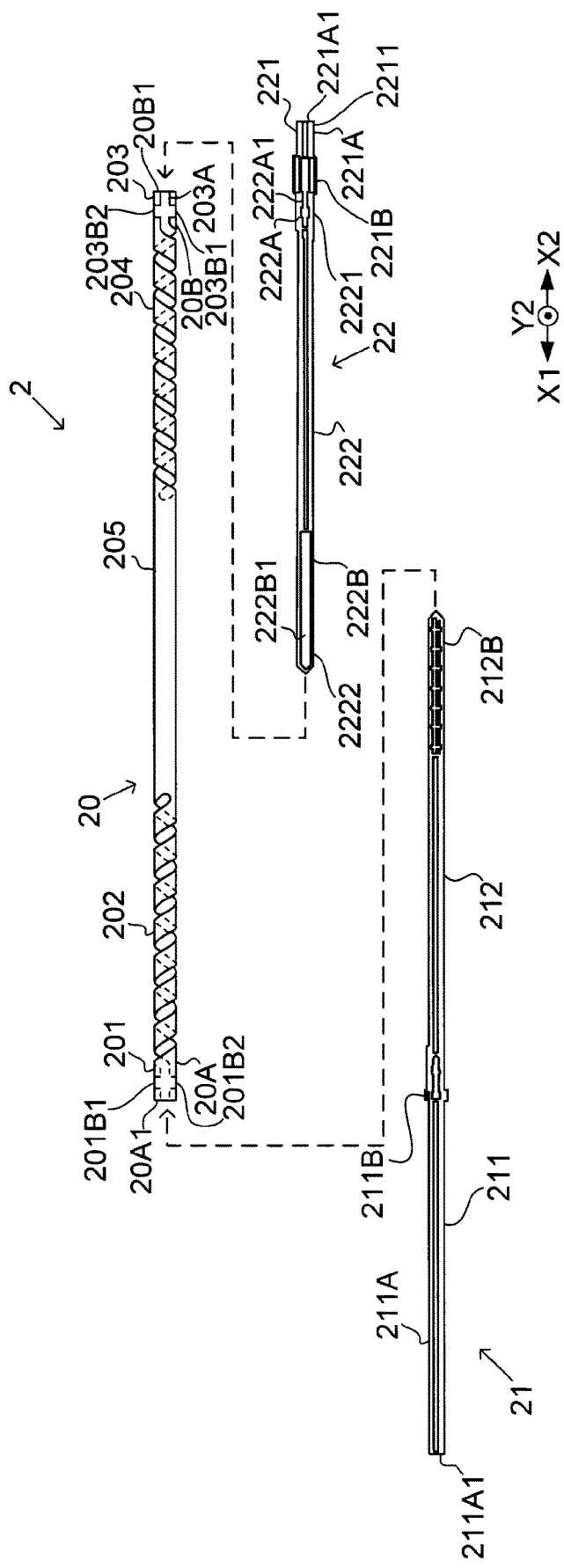
FIG. 3 is an exploded top view illustrating the contact terminal.

Next, the configuration of the contact terminal 2 will be described in more detail. FIG. 2 is an exploded side view illustrating the contact terminal 2 disassembled into a tubular body 20, a first conductor 21, and a second conductor 22. FIG. 3 is a top view illustrating the contact terminal 2 disassembled into the tubular body 20, the first conductor 21, and the second conductor 22.

As illustrated in FIGS. 2 and 3, the contact terminal 2 includes the tubular body 20 extending in the axial direction of the contact terminal 2, a conductive bar-shaped first conductor (plunger) 21, and a bar-shaped second conductor (plunger) 22. The first conductor 21 and the second conductor 22 are formed of, for example, a conductive material such as a nickel alloy.

The tubular body 20 has a cylindrical shape, and is formed of, for example, a nickel or nickel-alloy tube having an outer diameter of about 25 to 300 μm and an inner diameter of about 10 to 250 μm. Preferably, the tubular body 20 has, on its inner peripheral surface, a plating layer such as a gold plating layer. In addition, the tubular body 20 may have an outer peripheral surface coated with an insulation coating as necessary.

The tubular body 20 has a first body portion 201 for fixing the first conductor 21 at one axial end portion 20A. The tubular body 20 has a first spring portion 202 connected to the first body portion 201 on the other axial direction X2 side. The tubular body 20 has a second body portion 203 for fixing the second conductor 22 at the other axial end portion 20B. The tubular body 20 has a second spring portion 204 that is connected with the second body portion 203 on one axial direction X1 side. The tubular body 20 has a third body portion 205 that connects the first spring portion 202 and the second spring portion 204.

The first spring portion 202 and the second spring portion 204 are formed as a spiral body extending in a spiral shape along the peripheral surface of the tubular body 20. In other words, the tubular body 20 includes the spring portions 202 and 204 each having a spiral shape along the peripheral surface of the tubular body 20.

In order to produce a tubular body having such a spiral body, for example, a gold plating layer is formed by plating on the outer periphery of a core material, and then a nickel electroforming layer is formed by electroforming on the outer periphery of the formed gold plating layer. A resist layer is formed on an outer periphery of the nickel electroforming layer, and then is exposed with a laser, so that the resist layer is partially removed in a spiral shape. Etching is performed using the resist layer as a masking material to remove the nickel electroforming layer at a place where the resist layer has been spirally removed. Then, after the resist layer is removed, the gold plating layer at the place where the nickel electroforming layer is spirally removed is removed, and the core material is removed while the gold plating layer is left on the inner periphery of the nickel electroforming layer to form a tubular body.

The first body portion 201, the second body portion 203, and the third body portion 205 each have a tubular shape provided with no spiral shape.

The shape of the tubular body 20 is not limited to the cylindrical shape, and may be, for example, a cylindrical shape having a rectangular annular shape such as a quadrangle or a hexagon in an axial sectional view.

As illustrated in FIGS. 2 and 3, the first conductor 21 includes a first protrusion 211 and a first insertion portion 212. Here, FIG. 4 is a perspective view of the first conductor 21.

Figure 4:
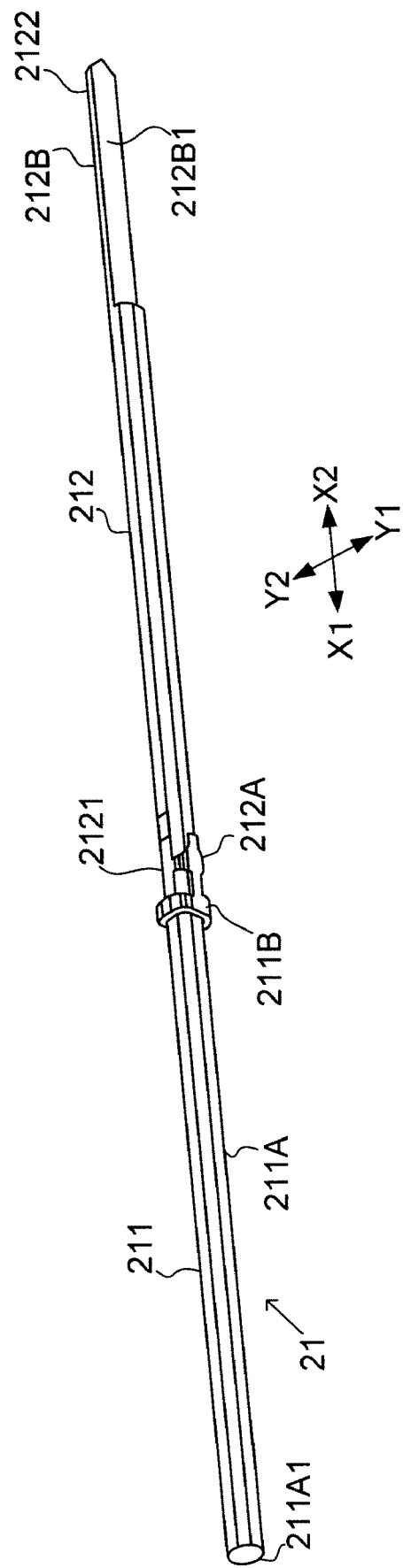
FIG. 4 is a perspective view of a first conductor.

The first conductor 21 illustrated in FIG. 4 is formed by lamination by MEMS technology with a direction perpendicular to the axial direction (axial perpendicular direction) as a laminating direction. In FIG. 4, one side in the axial perpendicular direction is indicated by Y1, and the other side is indicated by Y2. In the MEMS technology, photolithography is used. By manufacturing the first conductor 21 by the MEMS technology, effects such as cost reduction at the time of mass production, ability to perform complicated shaping, and ability to perform miniaturized shaping can be obtained.

The first protrusion 211 includes a bar-shaped main body 211A and a flange 211B connected to the other axial direction X2 side of the bar-shaped main body 211A. A tip portion 211A1 disposed on the one axial direction X1 side of the bar-shaped main body 211A is in contact with an inspection point of the inspection target 30 as described later. In the example of FIG. 4, the tip portion 211A1 has a planar shape, but is not limited thereto, and may have, for example, a conical shape, a truncated conical shape, a hemispherical shape, or the like.

The first insertion portion 212 has a snap-fit portion 212A at the one axial end portion 2121 of the first insertion portion 212. The snap-fit portion 212A is formed along the outer periphery of the first insertion portion 212 and is connected to the flange 211B on the other axial direction X2 side. The snap-fit portion 212A is a portion for fixing the first insertion portion 212 to the first body portion 201 of the tubular body 20, and the configuration thereof will be described later in detail. The snap-fit portion 212A is easily formed by the MEMS technology.

The first insertion portion 212 has a first contact portion 212B at the other axial end portion 2122 of the first insertion portion 212. The first contact portion 212B has a first flat surface 212B1 along the axial direction. The first contact portion 212B has a stacked configuration in which the directions Y1 and Y2 perpendicular to the axial direction are the laminating direction. As a result, the first contact portion 212B can be manufactured with high accuracy by the MEMS technology.

The first flat surface 212B1 is a flat surface perpendicular to the laminating direction. Although the first flat surface 212B1 can be formed as a flat surface along the laminating direction, the first flat surface 212B1 can be formed with high accuracy when the first flat surface is a flat surface perpendicular to the laminating direction.

When the first conductor 21 having such a configuration is assembled to the tubular body 20, as indicated by broken line arrows in FIGS. 2 and 3, if the first contact portion 212B is inserted into the first body portion 201 of the tubular body 20 and the first conductor 21 is pushed into the tubular body 20, the first insertion portion 212 is fixed to the first body portion 201 by the snap-fit portion 212A. In this state, the flange 211B is brought into contact with the tubular body 20 on the one axial end surface 20A1. Therefore, the flange 211B and the bar-shaped main body 211A are disposed on the one axial direction X1 side with respect to the tubular body 20. That is, the first conductor 21 has the first protrusion 211 that protrudes to the one axial direction X1 side from the tubular body 20.

Figure 5A:
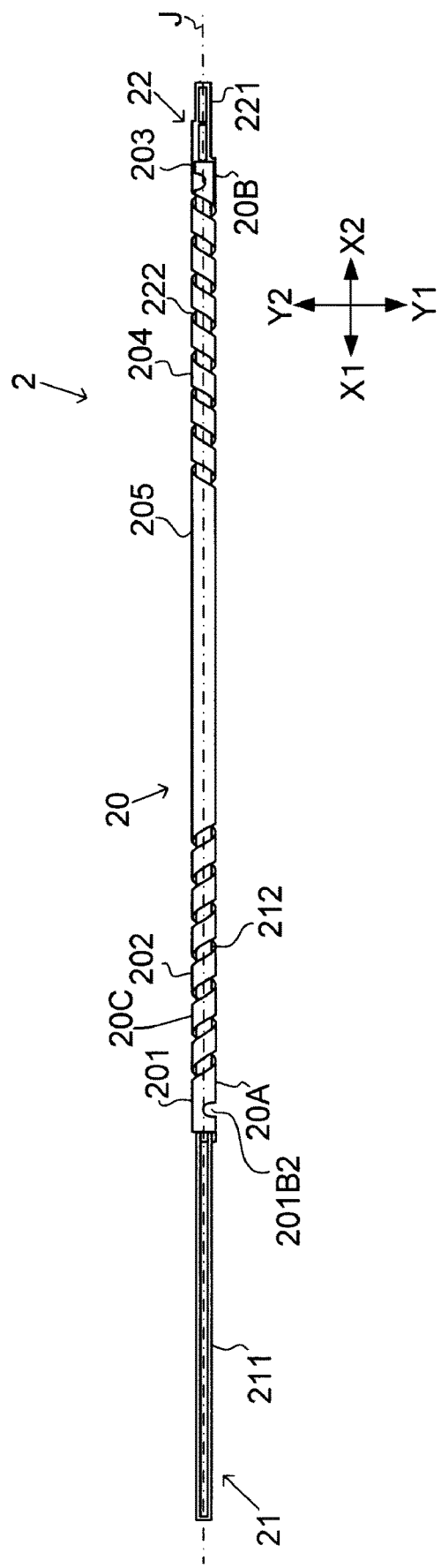
FIG. 5A is a side view of the contact terminal.
Figure 5B:
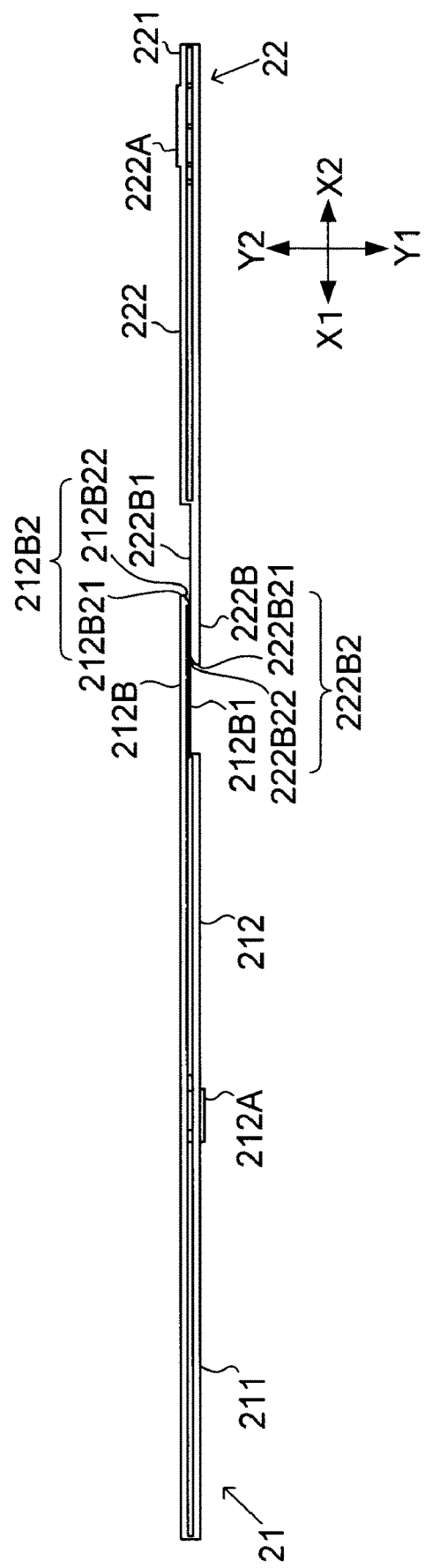
FIG. 5B is a side view illustrating only the first conductor and the second conductor in the state of FIG. 5A.
Figure 6:
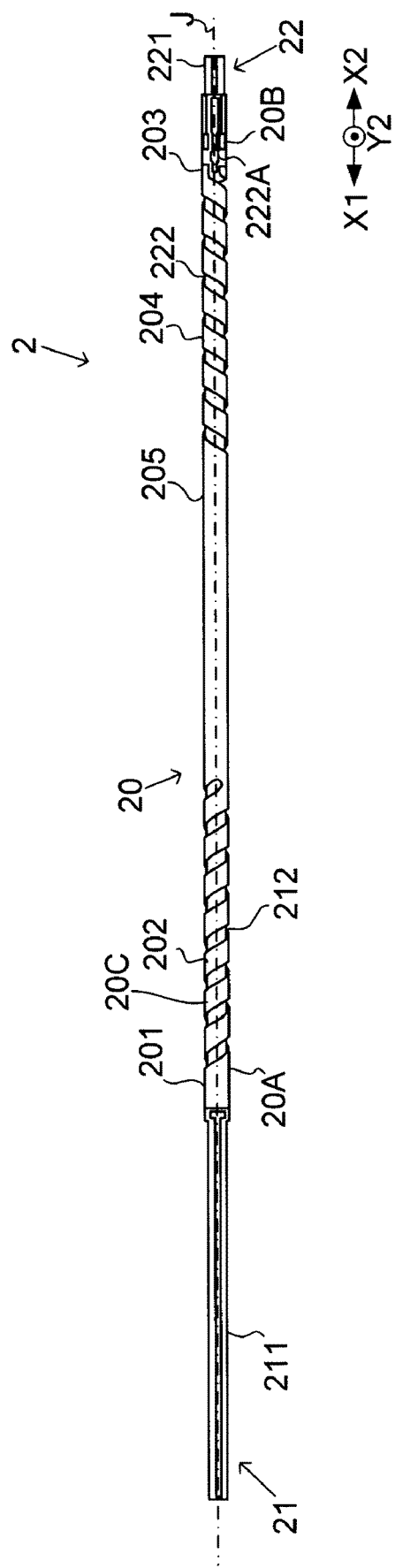
FIG. 6 is a top view of the contact terminal.

Here, FIG. 5A illustrates a side view of the contact terminal 2, and FIG. 6 illustrates a top view of the contact terminal 2. That is, FIGS. 5A and 6 illustrate a state in which the first conductor 21 and the second conductor 22 are assembled to the tubular body 20. FIG. 5B is a side view illustrating only the first conductor 21 and the second conductor 22 in a state where the first conductor 21 and the second conductor 22 are assembled to the tubular body 20 as illustrated in FIG. 5A.

In addition, circumferential notches 201B1 and 201B2 (see FIG. 3) are provided in the first body portion 201 for fitting with the snap-fit portion 212A. The first insertion portion 212 is disposed inside an outer periphery 20C of the tubular body 20. The first insertion portion 212 is fixed to the one axial end portion 20A of the tubular body 20. The first insertion portion 212 is fixed by snap fitting, but is not limited thereto, and may be fixed by press fitting, welding, caulking, or the like. Therefore, the first conductor 21 includes the first insertion portion 212 that is disposed inside the outer periphery 20C of the tubular body 20 and is fixed to the one axial end portion 20A of the tubular body 20. The configuration of the circumferential notches 201B1 and 201B2 will be described in detail later.

As illustrated in FIGS. 2 and 3, the second conductor 22 includes a second protrusion 221 and a second insertion portion 222.

Similarly to the first conductor 21, the second conductor 22 is also formed by lamination by the MEMS technology with the direction perpendicular to the axial direction as the laminating direction, and the same effect as that of the first conductor 21 can be obtained.

As illustrated in FIG. 3, the second protrusion 221 includes a bar-shaped main body 221A and a flange 221B connected to the bar-shaped main body 221A on the one axial direction X1 side. The tip portion 221A1 disposed at the other axial end portion 2211 of the bar-shaped main body 221A is in contact with the first electrode 41 of the pitch conversion unit 4. In the example of FIG. 3, the tip portion 221A1 has a planar shape, but the present disclosure is not limited thereto. This is similar to the tip portion 211A1.

The second insertion portion 222 has a snap-fit portion 222A at the other axial end portion 2221 of the second insertion portion 222. The snap-fit portion 222A is formed along the outer periphery of the second insertion portion 222 and is connected to the flange 221B on the one axial direction X1 side. The snap-fit portion 222A is a portion for fixing the second insertion portion 222 to the second body portion 203 of the tubular body 20, and has the same configuration as the snap-fit portion 212A.

The second insertion portion 222 has a second contact portion 222B at one axial end portion 2222 of the second insertion portion 222. The second contact portion 222B has a second flat surface 222B1 along the axial direction. The second contact portion 222B has a laminated configuration in which a direction perpendicular to the axial direction is a laminating direction. As a result, the second contact portion 222B can be manufactured with high accuracy by the MEMS technology.

The second flat surface 222B1 is a flat surface perpendicular to the laminating direction. The second flat surface 222B1 can be formed as a flat surface along the laminating direction, but the second flat surface 222B1 can be formed with high accuracy when the flat surface is perpendicular to the laminating direction.

When the second conductor 22 having such a configuration is assembled to the tubular body 20, the second contact portion 222B is inserted into the second body portion 203 of the tubular body 20 as indicated by broken line arrows in FIGS. 2 and 3. When the second conductor 22 is pushed into the tubular body 20, the second insertion portion 222 is fixed to the second body portion 203 by the snap-fit portion 222A. In this state, the flange 221B is brought into contact with the other axial end surface 20B1 of the tubular body 20. Therefore, the flange 221B and the bar-shaped main body 221A are disposed on the other axial direction X2 side with respect to the tubular body 20. That is, the second conductor 22 has the second protrusion 221 that protrudes from the tubular body 20 toward the other axial direction X2 side.

Further, the second body portion 203 is provided with circumferential notches 203B1 and 203B2 (see FIG. 3) for fitting with the snap-fit portion 222A, similarly to the first body portion 201. The second insertion portion 222 is disposed inside the outer periphery 20C of the tubular body 20. The second insertion portion 222 is fixed to the other axial end portion 20B of the tubular body 20. The second insertion portion 222 is fixed by snap fitting, but is not limited thereto, and may be fixed by press fitting, welding, caulking, or the like. Therefore, the second conductor 22 includes the second insertion portion 222 that is disposed inside the outer periphery 20C of the tubular body 20 and is fixed to the other axial end portion 20B of the tubular body 20.

Note that the fixing point by the snap-fit portion 212A and the fixing point by the snap-fit portion 222A are arranged at angular positions separated by 180° around the central axis J as viewed in the axial direction.

In a state where the first conductor 21 and the second conductor 22 are assembled to the tubular body 20, as illustrated in FIG. 5B, the first flat surface 212B1 of the first contact portion 212B and the second flat surface 222B1 of the second contact portion 222B are in contact with each other. That is, the first flat surface 212B1 and the second flat surface 222B1 are in contact with each other in the natural state of the first spring portion 202 and the second spring portion 204. As a result, when the first spring portion 202 and the second spring portion 204 are compressed in the axial direction, the first flat surface 212B1 and the second flat surface 222B1 come into contact with each other while sliding on each other. That is, when the first contact portion 212B and the second contact portion 222B move from the natural state of the spring portions 202 and 204, the contact between the first flat surface 212B1 and the second flat surface 222B1 is maintained, so that the conduction state between the first conductor 21 and the second conductor 22 is stabilized.

Figure 7:
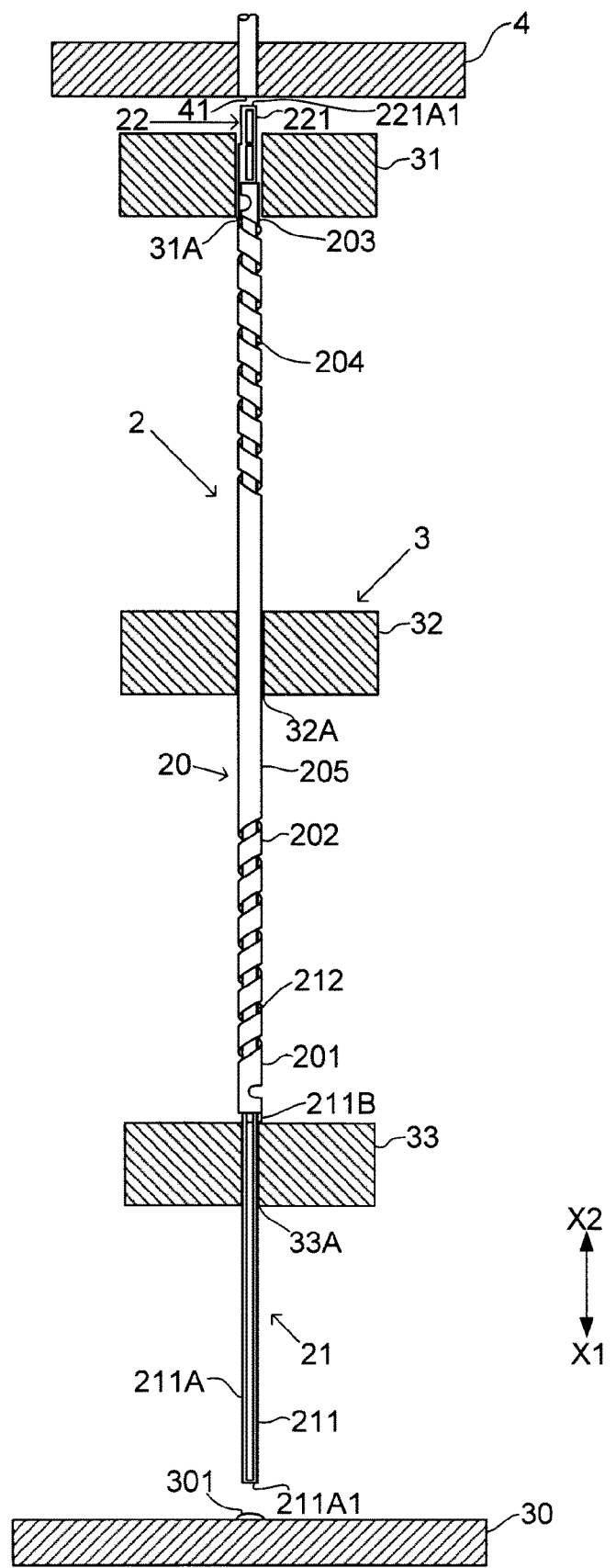
FIG. 7 is a diagram illustrating a state in which the contact terminal is supported by a support member.

Here, FIG. 7 is a diagram illustrating a state in which the contact terminal 2 is supported by the support member 3. As illustrated in FIG. 7, the support member 3 includes an upper support body 31, an intermediate support body 32, and a lower support body 33. The lower support body 33 has a support hole 33A which is a through hole penetrating in the axial direction. The sectional area of the support hole 33A as viewed in the axial direction is slightly larger than the sectional area of the bar-shaped main body 211A as viewed in the axial direction and is smaller than the sectional area of the flange 211B as viewed in the axial direction. As a result, the bar-shaped main body 211A can be inserted into the support hole 33A, and the flange 211B prevents the contact terminal 2 from falling off.

The intermediate support body 32 is disposed above the lower support body 33 and has a support hole 32A which is a through hole coaxial with the support hole 33A. The sectional area of the support hole 32A as viewed in the axial direction is slightly larger than the outer sectional area of the third body portion 205 as viewed in the axial direction. As a result, the third body portion 205 can be inserted into the support hole 32A.

The upper support body 31 is disposed above the intermediate support body 32 and has a support hole 31A which is a through hole coaxial with the support hole 32A. The sectional area of the support hole 31A as viewed in the axial direction is slightly larger than the outer sectional areas of the second body portion 203 and the second protrusion 221 as viewed in the axial direction. Accordingly, the second body portion 203 and the second protrusion 221 can be inserted into the support hole 31A.

When the contact terminal 2 is supported by the support member 3, the bar-shaped main body 211A is sequentially inserted into the support hole 31A, the support hole 32A, and the support hole 33A from above. The support holes 31A and 32A have a cross section as viewed in the axial direction through which the flange 211B can be inserted.

In addition, the support member 3 may be disassembled into the upper support body 31, the intermediate support body 32, and the lower support body 33. In this case, the bar-shaped main body 211A is inserted into the lower support body 33. Next, the intermediate support body 32 is fixed to the lower support body 33 while the third body portion 205 is inserted into the intermediate support body 32. Then, the upper support body 31 is fixed to the intermediate support body 32 while the second body portion 203 and the second protrusion 221 are inserted into the upper support body 31.

In a state where the probe head 1 is assembled by the contact terminal 2 and the support member 3, the bar-shaped main body 211A is inserted into the support hole 33A. The flange 211B is brought into contact with the upper surface of the lower support body 33. The third body portion 205 is inserted into the support hole 32A. The second body portion 203 and the second protrusion 221 are inserted into the support hole 31A. Thus, the contact terminal 2 is supported by the support member 3.

Then, the upper surface of the upper support body 31 is pressed against the lower surface of the pitch conversion unit 4 while bringing a tip portion 221A1 of the second protrusion 221 into contact with the first electrode 41 exposed on the lower surface of the pitch conversion unit 4. Thus, the support member 3 is fixed to the pitch conversion unit 4. At this time, the first spring portion 202 and the second spring portion 204 are compressed in the axial direction, and the first flat surface 212B1 and the second flat surface 222B1 come into contact with each other while sliding on each other. As a result, a tip portion 221A1 is pressed against the first electrode 41 by the elastic force of the spring portions 202 and 204, and the tip portion 221A1 and the first electrode 41 are held in a stable conductive contact state.

Further, when the inspection target 30 is inspected, the tip portion 211A1 of the bar-shaped main body 211A is brought into contact with an inspection point 301 of the inspection target 30. At this time, a force toward the other axial direction X2 side is applied to the tip portion 211A1, and the first spring portion 202 and the second spring portion 204 are compressed in the axial direction. As a result, the tip portion 211A1 is pressed against the inspection point 301 by the elastic force of the spring portions 202 and 204, and the tip portion 211A1 and the inspection point 301 are held in a stable conductive contact state. At this time, the first flat surface 212B1 and the second flat surface 222B1 come into contact with each other while sliding on each other.

When the inspection target 20 is inspected, the first spring portion 202 and the second spring portion 204 are most compressed. In this state, the other axial end surface 212B21 (see FIG. 5B) of the first contact portion 212B is not in contact with the second insertion portion 222, and one axial end surface 222B21 (see FIG. 5B) of the second contact portion 222B is not in contact with the first insertion portion 212.

Figure 8:
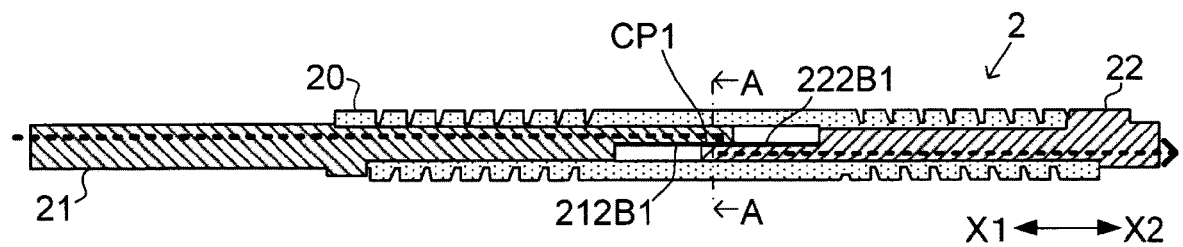
FIG. 8 is a schematic side sectional view of the contact terminal.

In this manner, the first flat surface 212B1 and the second flat surface 222B1 are in contact with each other. Here, FIG. 8 is a schematic side sectional view of the contact terminal 2. As illustrated in FIG. 8, the first flat surface 212B1 and the second flat surface 222B1 come into contact with each other to form a sliding contact point CP1. As indicated by an arrow in FIG. 8, the current path can be a path through the first conductor 21 and the second conductor 22 via the sliding contact point CP1 without passing through the tubular body 20. Therefore, the number of contact point can be reduced, and the contact resistance inside the contact terminal 2 can be reduced.

Figure 9:
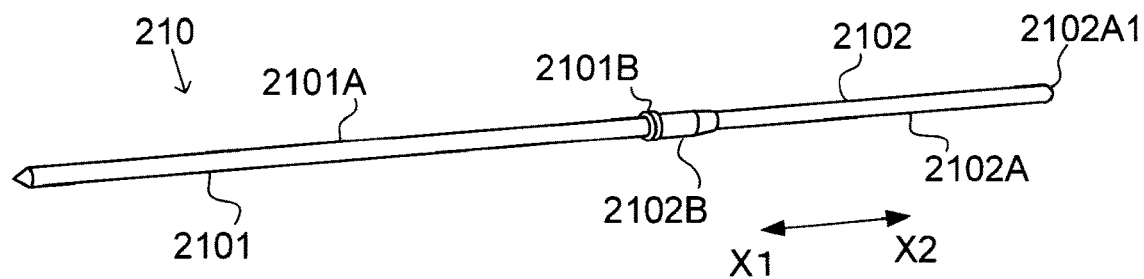
FIG. 9 is a perspective view of the first conductor according to a comparative example.

Here, FIG. 9 is a perspective view of a first conductor 210 according to a comparative example. The first conductor 210 is formed by cutting using a lathe. The first conductor 210 includes a first protrusion 2101 and a first insertion portion 2102. The first protrusion 210 includes a bar-shaped main body 2101A and a flange 2101B. The first insertion portion 2102 includes a bar-shaped main body 2102A and a press-fitting portion 2102B contiguous with the bar-shaped main body 2102A on the one axial direction X1 side. The press-fitting portion 2102B is larger in outer diameter than the bar-shaped main body 2102A.

Figure 10:
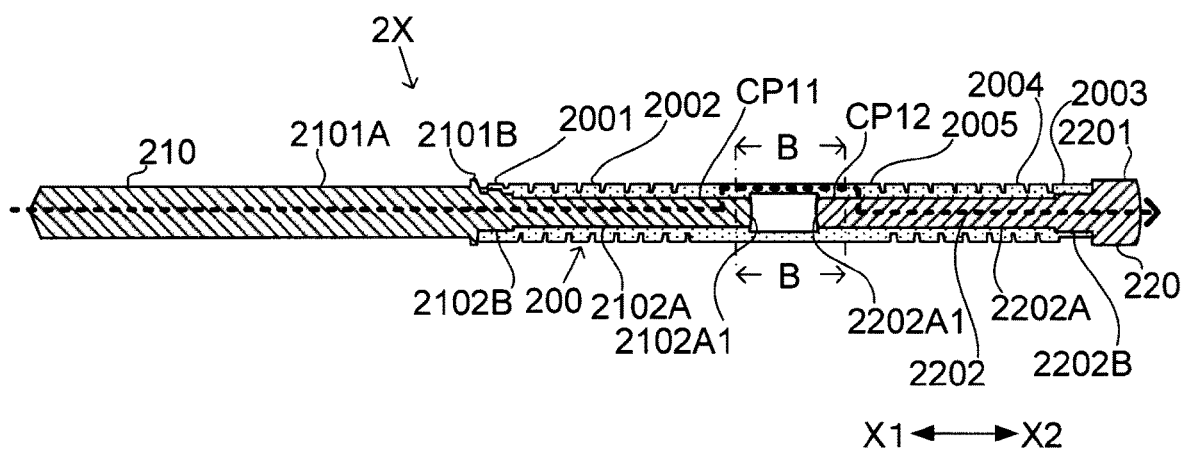
FIG. 10 is a schematic side sectional view of the contact terminal according to a comparative example.

FIG. 10 is a schematic side sectional view of a contact terminal 2X according to a comparative example. The contact terminal 2X according to the comparative example includes a tubular body 200, a first conductor 210, and a second conductor 220. The tubular body 200 includes a first body portion 2001, a first spring portion 2002, a second body portion 2003, a second spring portion 2004, and a third body portion 2005.

As illustrated in FIG. 10, when the first conductor 210 is assembled to the tubular body 200, the bar-shaped main body 2102A is inserted into the tubular body 200, and the press-fitting portion 2102B is fixed to the first body portion 2001 by press-fitting. As a result, the first protrusion 210 protrudes to the one axial direction X1 side from the tubular body 200, and a tip portion 2102A1 provided in the bar-shaped main body 2102A on the other axial direction X2 side is located inside the third body portion 2005.

On the other hand, the second conductor 220 includes a second protrusion 2201 and a second insertion portion 2202. The second insertion portion 2202 includes a bar-shaped main body 2202A and a press-fitting portion 2202B. The bar-shaped main body 2202A is inserted into the tubular body 200, and the press-fitting portion 2202B is fixed to the second body portion 2003 by press-fitting. As a result, the second protrusion 2201 protrudes from the tubular body 200 toward the other axial direction X2 side. A tip portion 2202A1 provided in the bar-shaped main body 2202A on the one axial direction X1 side is located inside the third body portion 2005.

In the contact terminal 2X according to such a comparative example, as illustrated in FIG. 10, a sliding contact point CP11 by contact between the bar-shaped main body 2102A and the third body portion 2005 and a sliding contact point CP12 by contact between the bar-shaped main body 2202A and the third body portion 2005 are formed. As a result, as indicated by arrows in FIG. 10, the current path becomes a path through the first conductor 210, the tubular body 200, and the second conductor 220 via the sliding contact points CP11 and CP12. Therefore, the number of sliding contact points increases, and the contact resistance inside the contact terminal increases.

Figure 11:
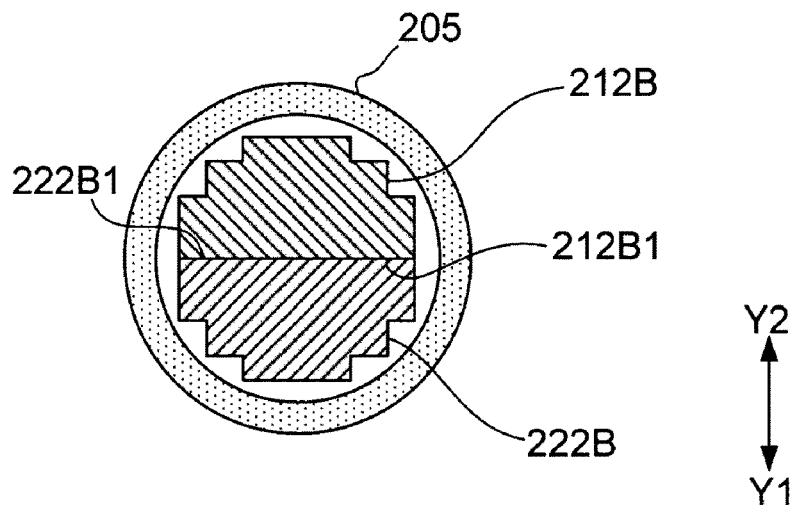
FIG. 11 is a sectional view taken along line A-A in FIG. 8.

FIG. 11 is an A-A sectional view of the sliding contact point CP1 in FIG. 8 as viewed in the axial direction. As illustrated in FIG. 11, both the cross section of the first contact portion 212B and the cross section of the second contact portion 222B have a shape along a semicircle as viewed in the axial direction. That is, in the surface where the first flat surface 212B1 and the second flat surface 222B1 are in contact with each other, the cross section of the first contact portion 212B as viewed in the axial direction and the cross section of the second contact portion 222B as viewed in the axial direction have substantially the same shape. As a result, the contact area between the first flat surface 212B1 and the second flat surface 222B1 can be increased.

As illustrated in FIG. 11, the first contact portion 212B and the second contact portion 222B have a laminated configuration in which a direction perpendicular to the axial direction is the laminating direction. As a result, the contact portions 212B and 222B and the tubular body 20 come into point contact with each other in the axial sectional view, but in the present embodiment, the current path does not pass through the contact point by the point contact.

Figure 12:
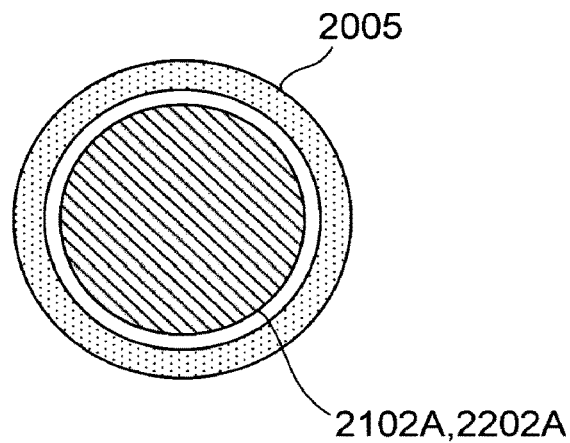
FIG. 12 is a sectional view taken along line B-B in FIG. 10.
Figure 13:
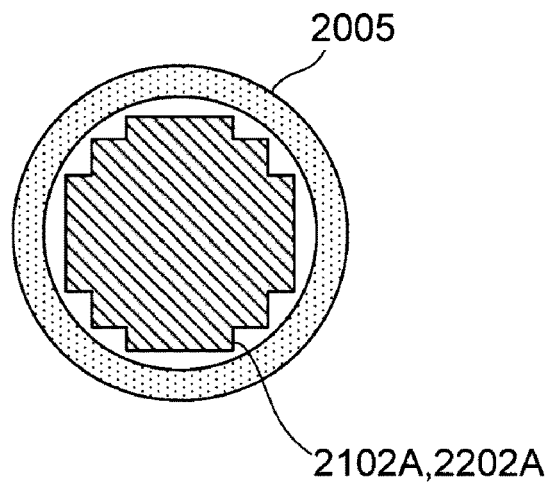
FIG. 13 is a sectional view taken along line B-B in a case where the first conductor and the second conductor in FIG. 10 are temporarily formed as a laminated configuration.

On the other hand, in the contact terminal 2X according to the comparative example described above, the following can be considered. FIG. 12 is a B-B sectional view at the sliding contact points CP11 and CP12 as viewed in the axial direction in the contact terminal 2X according to the comparative example illustrated in FIG. 10. FIG. 13 is a B-B sectional view at the sliding contact points CP11 and CP12 as viewed in the axial direction in a case where the first conductor 210 and the second conductor 220 in the contact terminal 2X according to the comparative example illustrated in FIG. 10 are formed as a laminated configuration in which the direction perpendicular to the axial direction is the laminating direction.

In FIG. 12, the contact between the first conductor 210 or the second conductor 220 and the tubular body 200 is surface contact in the axial sectional view, but in FIG. 13, the contact is point contact in the axial sectional view. In FIG. 13, since the current path passes through the tubular body 200, the electric resistance value of the current path is considered to be larger than that in FIG. 12.

Next, a snap-fit structure for fixing the first conductor 21 or the second conductor 22 to the tubular body 20 will be specifically described.

Figure 14:
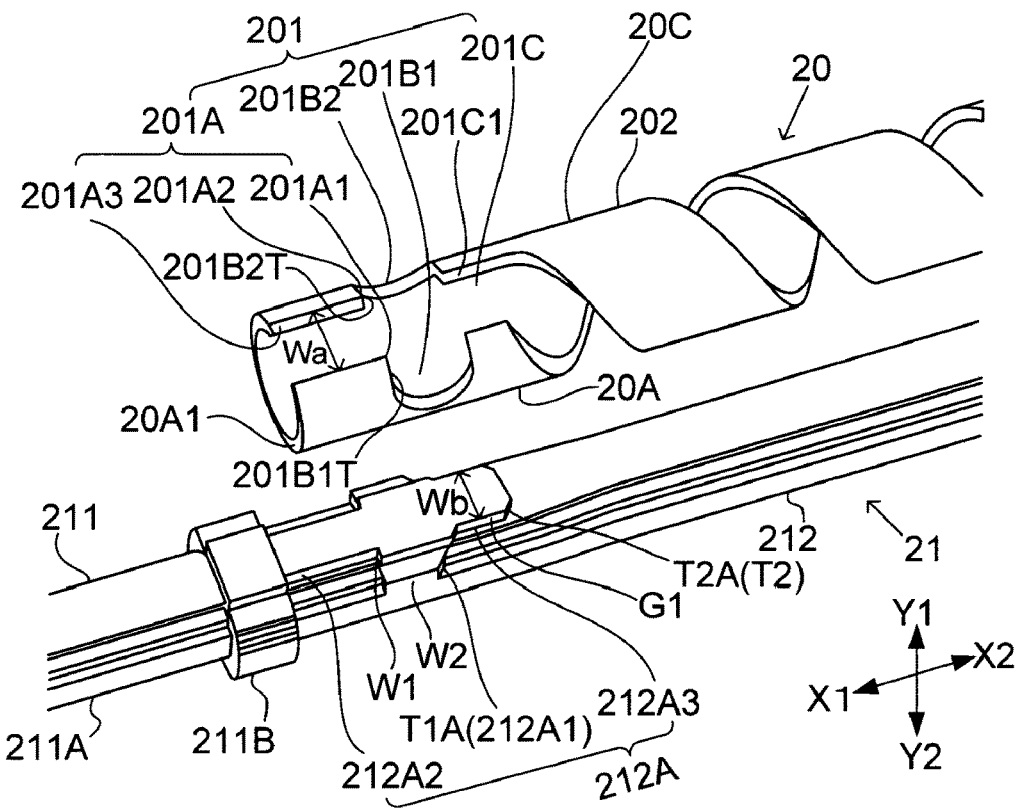
FIG. 14 is an enlarged view of a main part related to a snap-fit structure.

FIG. 14 is an enlarged view of a main part of the snap-fit structure for fixing the first conductor 21 to the tubular body 20. The first body portion 201 of the tubular body 20 includes a first end side notch 201A, a first circumferential notch 201B1, and a second circumferential notch 201B2. The first end side notch 201A is formed in a shape cut from the one axial end surface 20A1 of the tubular body 20 toward the other axial direction X2 side. The first circumferential notch 201B1 is connected to the other axial direction X2 side of the first end side notch 201A, and is formed in a shape cut along the circumferential direction away from the first end side notch 201A from a circumferential first end portion 201A1 of the first end side notch 201A. The second circumferential notch 201B2 is connected to the other axial direction X2 side of the first end side notch 201A, and is formed in a shape cut along the circumferential direction away from the first end side notch 201A from a circumferential second end portion 201A2 of the first end side notch 201A.

That is, the tubular body 20 includes the first end side notch 201A provided along the axial direction on the peripheral surface of the one axial end portion 20A of the tubular body 20, and the first circumferential notch 201B1 connected to the first end side notch 201A on the other axial direction X2 side and provided along the circumferential direction away from the first end side notch 201A from the circumferential first end portion 201A1 of the first end side notch 201A.

The insertion portion 212 of the first conductor 21 has the snap-fit portion 212A as described above. The snap-fit portion 212A includes a first inclined portion 212A1, a first wall surface portion W1, a first end side rib 212A2, and a first center side rib 212A3. The first inclined portion 212A1 has the inclined surface T1A that is farther from the central axis J toward the one axial direction X1 side as viewed in the direction perpendicular to the axial direction.

The first wall surface portion W1 is disposed in the first inclined portion 212A1 on the one axial direction X1 side. In a state where the first insertion portion 212 is inserted into the tubular body 20, at least a part of the first wall surface portion W1 is disposed in the first circumferential notch 201B1. At this time, the first wall surface portion W1 may be able to come into contact with the tubular body 20 by the first insertion portion 212 being slightly movable in the axial direction, or the first wall surface portion W1 may always come into contact with the tubular body 20 by the first insertion portion 212 being immovable in the axial direction.

That is, the insertion portion 212 includes the first inclined portion 212A1 and the first wall surface portion W1 arranged on the one axial direction X1 side of the first inclined portion 212A1. The first inclined portion 212A has the inclined surface T1A that is farther from the central axis J toward the one axial direction X1 side as viewed in the direction perpendicular to the axial direction. The first wall surface portion W1 can come into contact with the tubular body 20.

As a result, when the first conductor 21 is fixed to the tubular body 20, the first inclined portion 212A1 is brought into contact with the one axial end surface 20A1 of the tubular body 20 to push the first conductor 21 into the tubular body 20, the first end side notch 201A expands due to elastic deformation. When the first conductor 21 is further pushed, the shape of the first end side notch 201A returns to the original shape, and at least a part of the first wall surface portion W1 is located in the first circumferential notch 201B1. At this time, the first wall surface portion W1 can come into contact with the tubular body 20. Therefore, it is possible to suppress the first conductor 21 from coming off the tubular body 20 by easy assembly.

Figure 15:
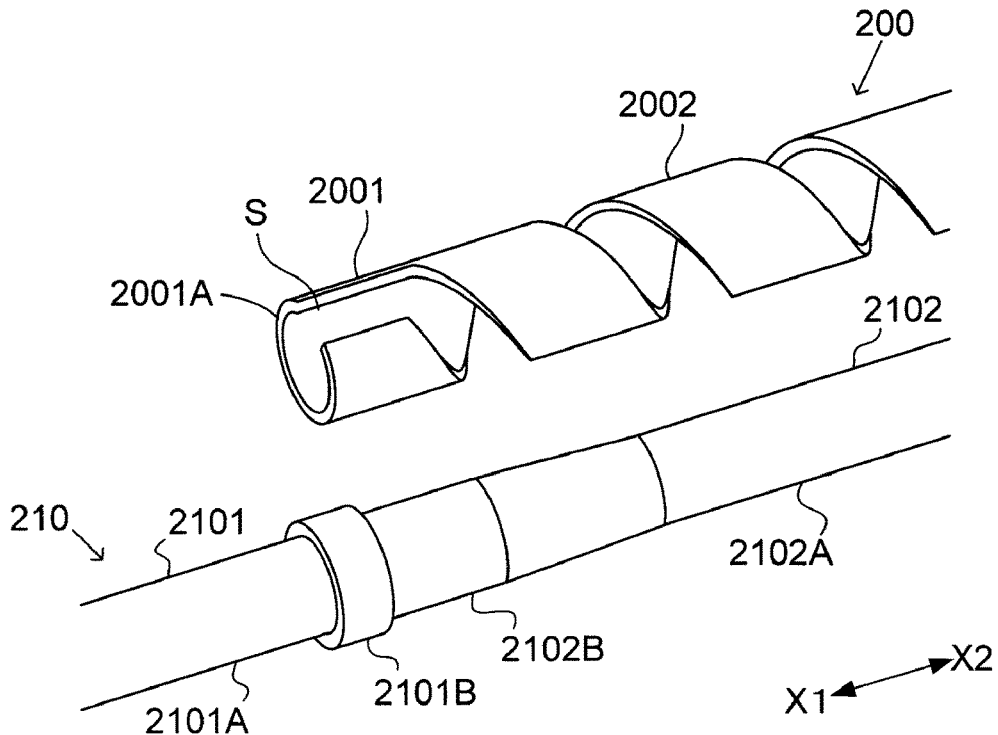
FIG. 15 is an enlarged view of a main part of a press-fitting structure according to a comparative example.

Here, FIG. 15 is an enlarged view of a main part related to a press-fitting structure for fixing the first conductor 210 to the tubular body 200 in the contact terminal 2X according to the comparative example described above. As illustrated in FIG. 15, in order to be fixed to the press-fitting portion 2102B of the first conductor 210, the first body portion 2001 of the tubular body 200 is provided with a notch S having a shape cut from one axial end surface 2001A toward the other axial direction X2 side.

In a state before the first conductor 210 is fixed to the tubular body 200, the outer diameter of the press-fitting portion 2102B is larger than the inner diameter of the first body portion 2001. As a result, when the bar-shaped main body 2102A of the first conductor 210 is inserted into the tubular body 200 and the press-fitting portion 2102B is pushed into the tubular body 200, the notch S expands, and the press-fitting portion 2102B is press-fitted and fixed to the first body portion 2001.

However, the fixing structure by snap-fitting as in the present embodiment can suppress the first conductor 21 from coming off the tubular body 20 as compared with such a fixing structure by press-fitting. In addition, as compared with FIG. 15, in the configuration of FIG. 14 according to the present embodiment, it is not necessary to increase the thickness of the first insertion portion 212 in the middle in the axial direction. As a result, the diameter of the contact terminal 2 can be reduced, and the interval between the contact terminals 2 can be narrowed.

Figure 16A:
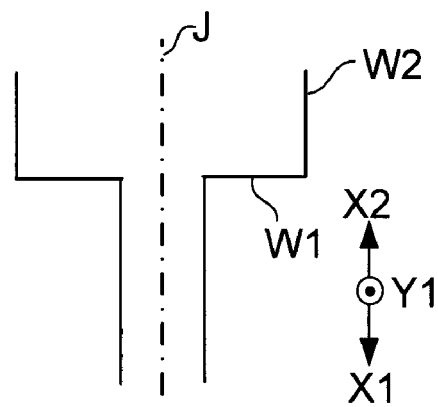
FIG. 16A is a schematic diagram illustrating a first configuration example of a first wall surface portion.

Here, as illustrated in FIG. 16A, the first wall surface portion W1 extends perpendicular to the axial direction when viewed from a direction perpendicular to the axial direction. As a result, the first wall surface portion W1 abuts on one axial end portion 201B1T of the first circumferential notch 201B1, so that it is possible to suppress the first conductor 21 from coming off.

Figure 16B:
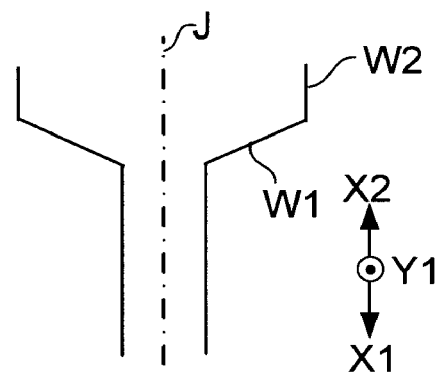
FIG. 16B is a schematic diagram illustrating a second configuration example of the first wall surface portion.

Note that the configuration of the first wall surface portion W1 is not limited to the above. For example, as illustrated in FIG. 16B, the first wall surface portion W1 may be configured to approach the central axis J as it goes toward the one axial direction X1 side as viewed from the direction perpendicular to the axial direction. As a result, when the first insertion portion 212 is inserted into the tubular body 20, the first end side notch 201A once expands and then gradually narrows. Therefore, the operator can more reliably fix the first insertion portion 212 to the tubular body 20 by confirming the change in the first end side notch 201A. In addition, the first conductor 21 can slightly move to the one axial direction X1 side in a state where the first insertion portion 212 is fixed. The operator can confirm the fixation of the first insertion portion 212 by confirming the movable state.

Figure 16C:
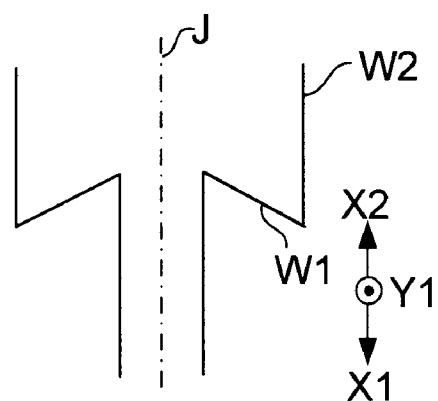
FIG. 16C is a schematic diagram illustrating a third configuration example of the first wall surface portion.

In addition, as illustrated in FIG. 16C, the first wall surface portion W1 may be configured to be separated from the central axis J as it goes toward the one axial direction X1 side as viewed from the direction perpendicular to the axial direction. Accordingly, it is possible to further suppress the first conductor 21 from coming off.

A second wall surface portion W2 is connected to the first inclined portion 212A1 on the one axial direction X1 side and linearly extends in the axial direction. As a result, the first insertion portion 212 can be moved into the tubular body 20 in a state where the first end side notch 201A is uniformly expanded.

The second wall surface portion W2 is not necessarily provided. That is, the first wall surface portion W1 may be connected to the first inclined portion 212A1.

The first end side rib 212A2 is connected to the first wall surface portion W1 on the one axial direction X1 side. The flange 211B is connected to the first end side rib 212A2 on the one axial direction X1 side. When the first conductor 21 is fixed to the tubular body 20, the first end side rib 212A2 is accommodated in the first end side notch 201A. At this time, the one axial end surface 20A1 of the tubular body 20 faces the flange 211B in the axial direction.

That is, the protrusion 211 has the flange 211B axially opposed to the one axial end surface 20A1 of the tubular body 20. As a result, the flange 211B abuts on the one axial end surface 20A1 of the tubular body 20, whereby the insertion of the first conductor 21 in the axial direction is restricted.

The first end side rib 212A2 is disposed between circumferential end surfaces 201A3 of the first end side notch 201A in a state of being accommodated in the first end side notch 201A. That is, the insertion portion 212 has the first end side rib 212A2 arranged between the circumferential end surfaces 201A3 of the first end side notch 201A. Consequently, the first conductor 21 can be rotationally positioned about the axial direction with respect to the tubular body 20. In the present embodiment, the first flat surface 212B1 and the second flat surface 222B1 are brought into contact with each other. Therefore, in order to obtain a favorable contact state, the first conductor 21 can be rotationally positioned.

The first center side rib 212A3 is connected to the first inclined portion 212A1 on the other axial direction X2 side. That is, the insertion portion 212 has the first center side rib 212A3 arranged on the other axial direction X2 side of the first inclined portion 212A1. The first center side rib 212A3 has a guide portion G1 having a width Wb. The width Wb is substantially the same as the width Wa between the circumferential end surfaces 201A3 of the first end side notch 201A.

Accordingly, by moving the first end side notch 201A using the guide portion G1 as a guide, the first end side notch 201A can be brought into contact with the first inclined portion 212A1 while defining the rotational position of the first end side notch 201A.

The first center side rib 212A3 has a second inclined portion T2 that is connected to the guide portion G1 on the other axial direction X2 side and has an inclined surface T2A approaching the central axis J toward the other axial direction X2 side as viewed in the direction perpendicular to the axial direction. Accordingly, when the first end side notch 201A abuts on the second inclined portion T2, the first end side notch 201A can move to the guide portion G1 using the second inclined portion T2 as a guide.

The first body portion 201 has a first center side notch 201C connected to the first circumferential notch 201B1 and the second circumferential notch 201B2 and formed along the axial direction on the peripheral surface of the first body portion 201. That is, the tubular body 20 has the first center side notch 201C provided along the axial direction on the peripheral surface of the tubular body 20. The first center side rib 212A3 is disposed between circumferential end surfaces 201C1 of the first center side notch 201C.

Consequently, the first conductor 21 can be rotationally positioned about the axial direction with respect to the tubular body 20. As described above, it is effective to perform rotational positioning of the first conductor 21 in order to obtain a favorable contact state between the first flat surface 212B1 and the second flat surface 222B1.

Note that the snap-fit fixing structure illustrated in FIG. 14 described above is also applied to a structure in which the second conductor 22 is fixed to the tubular body 20 by snap-fitting. That is, the configuration of the snap-fit portion 222A of the second conductor 22 corresponds to the configuration of the snap-fit portion 212A, and the notch configuration in the second body portion 203 of the tubular body 20 corresponds to the configuration of the first body portion 201. Note that any one of the snap-fit portion 212A and the snap-fit portion 222A may not be provided, and instead, a fixing structure by press fitting or the like may be provided.

That is, the tubular body 20 has at least one of a first end side notch 201A provided along the axial direction on the peripheral surface of the one axial end portion 20A of the tubular body 20 and a second end side notch 203A (see FIG. 3) provided along the axial direction on the peripheral surface of the other axial end portion 20B of the tubular body 20. When the first end side notch 201A is provided, the first insertion portion 212 has the first end side rib 212A2 arranged between the circumferential end surfaces 201A3 of the first end side notch 201A. When the second end side notch 203A is provided, the second insertion portion 222 has a second end side rib 222A1 (see FIG. 3) disposed between the circumferential end surfaces of the second end side notch 203A. As a result, the rotation of at least one of the first conductor 21 and the second conductor 22 in the circumferential direction is restricted, and the rotational positioning of at least one of the first conductor 21 and the second conductor 22 that brings the first flat surface 212B1 into contact with the second flat surface 222B1 can be performed. That is, when the contact terminal 2 is manufactured by inserting at least one of the first conductor 21 and the second conductor 22 into the tubular body 20, since the rotation is restricted, it is easy to insert at least one of the first conductor 21 and the second conductor 22. That is, the electric resistance value of the current path can be reduced while improving the assemblability.

In addition, as illustrated in FIG. 5B, a first chamfered portion 212B22 or a first round portion 212B22 that is away from the second flat surface 222B1 from the contact position between the first flat surface 212B1 and the second flat surface 222B1 toward the other axial direction X2 side is provided at the other axial end portion 212B2 of the first contact portion 212B. A second chamfered portion 222B22 or a second round portion 222B22 that is separated from the first flat surface 212B1 toward the one axial direction X1 side from the contact position between the first flat surface 212B1 and the second flat surface 222B1 is provided at the one axial end portion 222B2 of the second contact portion 222B.

As a result, at least one of the first conductor 21 and the second conductor 22 can be smoothly inserted into the tubular body 20.

Figure 17:
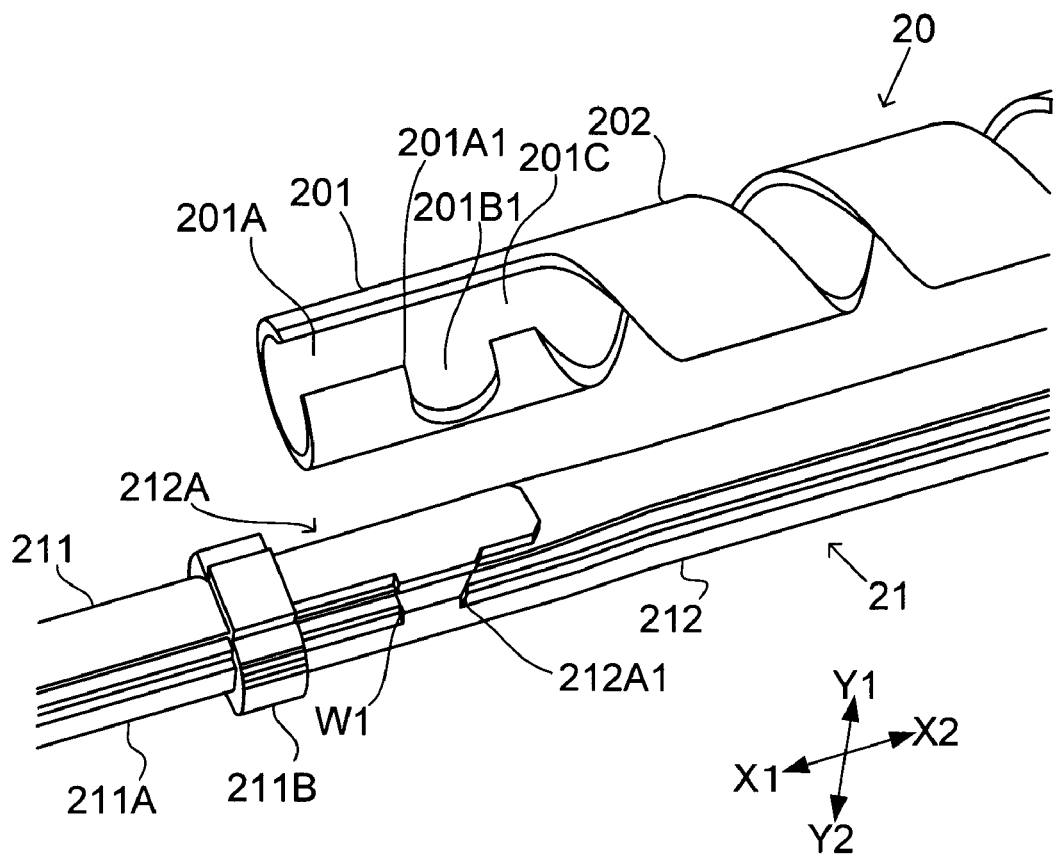
FIG. 17 is an enlarged view of a main part related to a modification of the snap-fit structure.

FIG. 17 is an enlarged view of a main part related to a modification of the snap-fit structure for fixing the first conductor 21 to the tubular body 20.

In the configuration illustrated in FIG. 17, unlike FIG. 14 described above, the first circumferential notch 201B1 is provided along the circumferential direction away from the first end side notch 201A from the circumferential first end portion 201A1 of the first end side notch 201A, and the second circumferential notch 201B2 is not provided. Accordingly, the first inclined portion 212A1 and the first wall surface portion W1 are formed only on one side with respect to the central axis J when viewed in a direction perpendicular to the axial direction. Even with such a configuration, since the first wall surface portion W1 can come into contact with the tubular body 20, the first conductor 21 is suppressed from coming off the tubular body 20.

However, as illustrated in FIG. 14, in the configuration in which the tubular body 20 has the second circumferential notch 201B2 provided along the circumferential direction away from the first end side notch 201A from the circumferential second end portion 201A2 of the first end side notch 201A, the coming-off of the first conductor 21 can be further suppressed.

Figure 18:
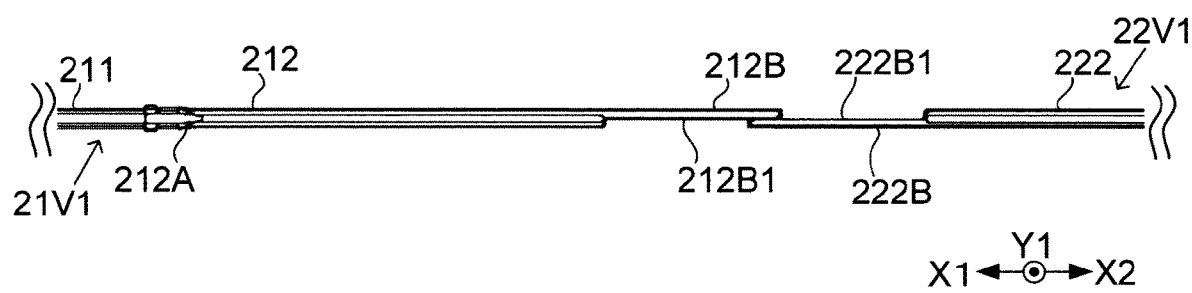
FIG. 18 is a diagram mainly illustrating the first conductor and the second conductor in a contact terminal according to a first modification.

Next, a contact terminal according to a first modification will be described. FIG. 18 is a diagram mainly illustrating a contact configuration between a first conductor 21V1 and a second conductor 22V1 in the contact terminal according to the first modification. FIG. 18 is a diagram of a spring portion of a tubular body (not illustrated) in a natural state.

In FIG. 18, one side in the direction perpendicular to the axis is indicated as Y1, and the other side is indicated as Y2. That is, in FIG. 18, the front side of the drawing is one axial perpendicular direction Y1 side, and the back side of the drawing is the other axial perpendicular direction Y2 side.

The first conductor 21V1 and the second conductor 22V1 are laminated along the axial perpendicular direction by the MEMS technology. The first insertion portion 212 of the first conductor 21V1 has the first contact portion 212B. The first contact portion 212B has the first flat surface 212B1 formed along the axial perpendicular direction. The second insertion portion 222 of the second conductor 22V1 has the second contact portion 222B. The second contact portion 222B has the second flat surface 222B1 formed along the axial perpendicular direction. That is, the first flat surface 212B1 and the second flat surface 222B1 are flat surfaces along the laminating direction. The first flat surface 212B1 and the second flat surface 222B1 are in contact with each other.

As illustrated in FIG. 18, the first insertion portion 212 of the first conductor 21V1 includes the snap-fit portion 212A. Here, details of the snap-fit portion 212A will be described.

Figure 19:
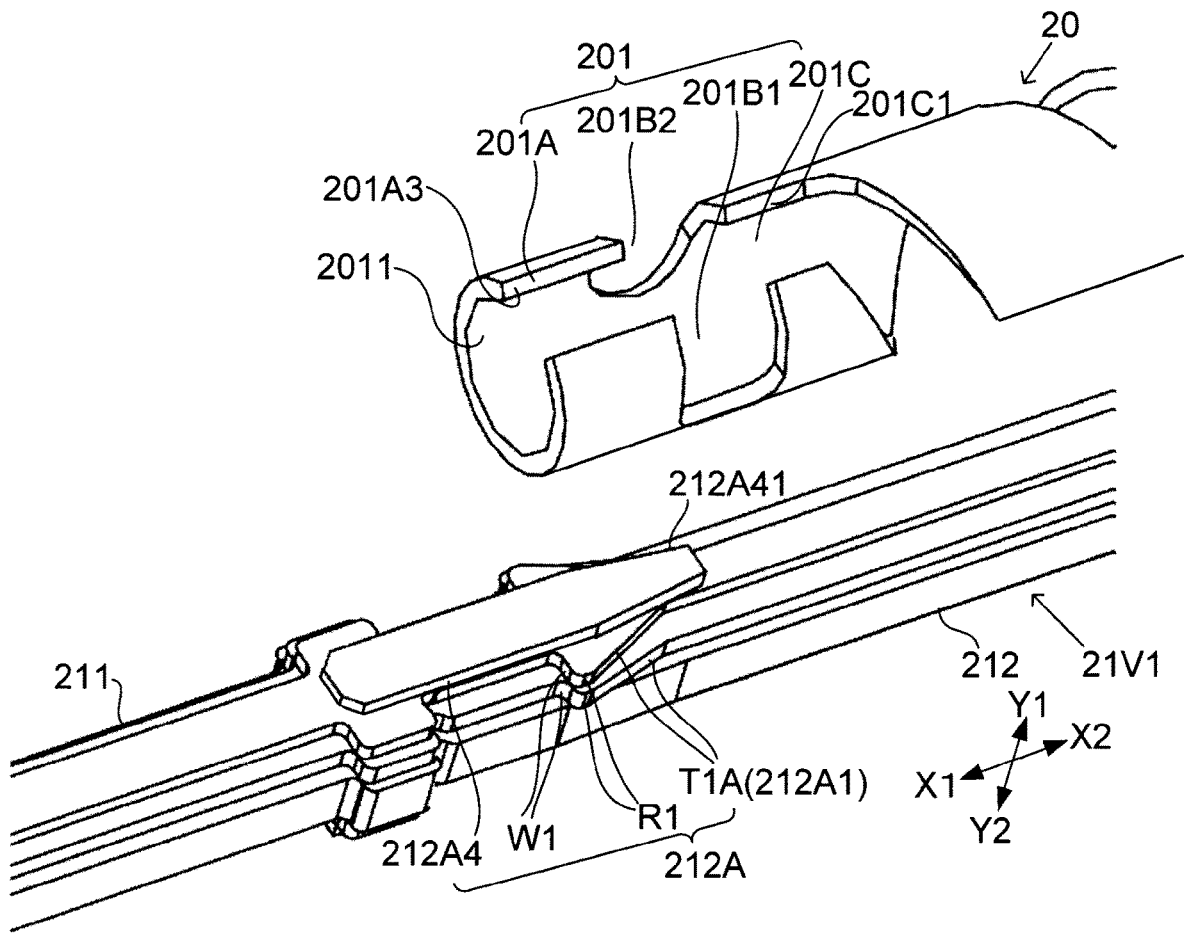
FIG. 19 is an enlarged view of a main part illustrating the snap-fit structure in the contact terminal according to the first modification.

As illustrated in FIG. 19, the snap-fit portion 212A has a stacked configuration in which the axial perpendicular direction is the laminating direction, and has a top rib 212A4 in a first layer when the one axial perpendicular direction Y1 side is the first layer. The top rib 212A4 has a tip portion 212A41 whose width narrows toward the other axial direction X2 side on the other axial direction X2 side.

The snap-fit portion 212A has the first inclined portion 212A1 having the inclined surface T1A in the second layer and the third layer. The snap-fit portion 212A has a round portion R1 connected to the inclined surface T1A on the one axial direction X1 side in the second layer and the third layer.

In addition, the snap-fit portion 212A has the first wall surface portion W1 extending perpendicular to the axial direction on the one axial direction X1 side as viewed from the direction perpendicular to the axial direction in the second layer and the third layer. The first wall surface portion W1 is not limited thereto, and may have the configuration illustrated in FIG. 16B or 16C described above.

When the first conductor 21V1 is fixed to the tubular body 20, the tip portion 212A41 is inserted into the first end side notch 201A. Then, when the first conductor 21V1 is pushed toward the other axial direction X2 side, the first end side notch 201A gradually expands due to the contact between the first inclined portion 212A1 and an inner peripheral surface 201I of the first body portion 201, and the first end side notch 201A expands the most due to the contact between the round portion R1 and the inner peripheral surface 201I.

Figure 20A:
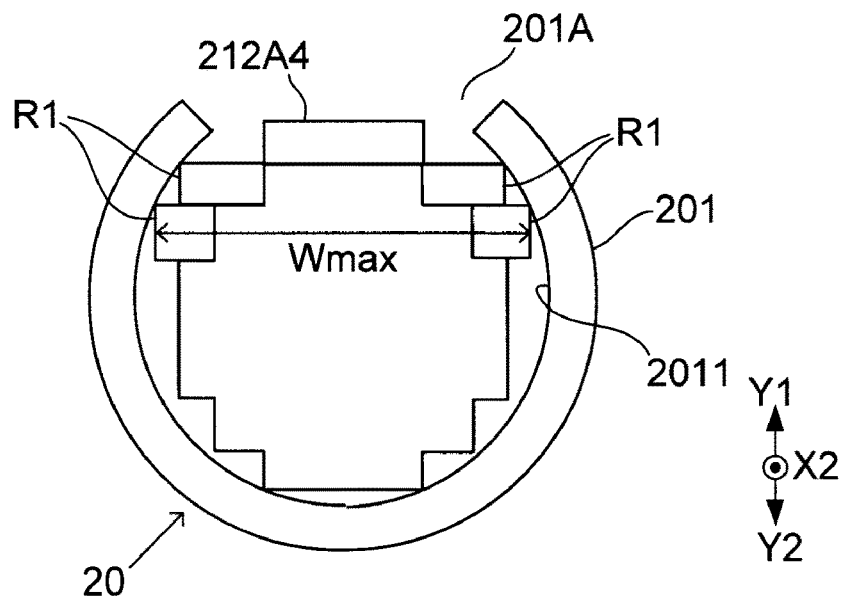
FIG. 20A is an axial sectional view illustrating a state in which a round portion is in contact with the inner peripheral surface of the tubular body in the assembly of the contact terminal according to the first modification.

FIG. 20A is a sectional view as viewed in the axial direction in a state where the round portion R1 and the inner peripheral surface 201I are in contact with each other and the first end side notch 201A is expanded. The width between the round portions R1 on both sides across the central axis J when viewed from the direction perpendicular to the axial direction is a maximum width Wmax in the axial direction of the first insertion portion 212. That is, FIG. 20A illustrates a cross section of the first insertion portion 212 at an axial position where the width of the first insertion portion 212 is maximum.

When the first wall surface portion W1 is positioned closer to the other axial direction X2 side than the first end side notch 201A by further pushing the first conductor 21V1 toward the other axial direction X2 side, the first end side notch 201A returns to its original shape. At this time, at least a part of the first wall surface portion W1 is disposed in the first circumferential notch 201B1, and the first wall surface portion W1 can come into contact with the tubular body 20.

Figure 20B:
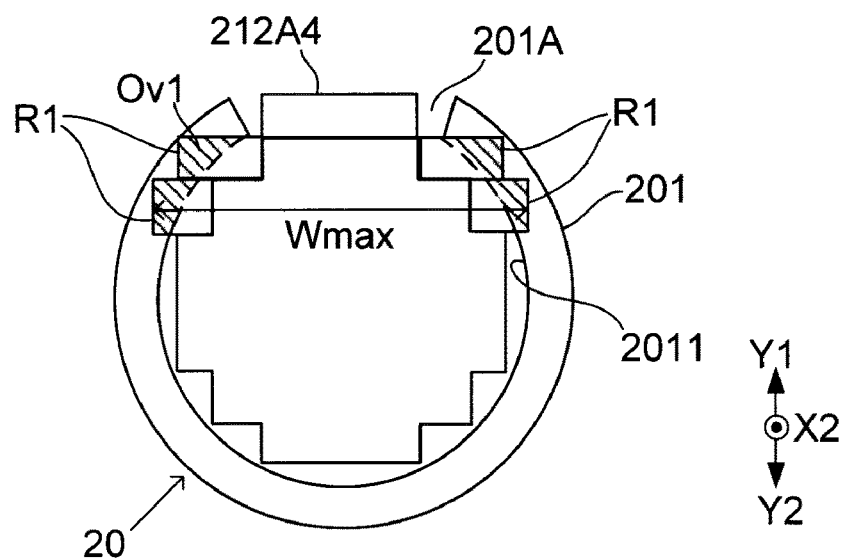
FIG. 20B is an axial sectional view illustrating a state in which the round portion is accommodated in a circumferential notch of the tubular body in the assembly of the contact terminal according to the first modification.

FIG. 20B is a sectional view as viewed in the axial direction in a state where at least a part of the first wall surface portion W1 is disposed in the first circumferential notch 201B1. FIG. 20B illustrates a cross section of the first insertion portion 212 at an axial position similar to that in FIG. 20A. As illustrated in FIG. 20B, when the first end side notch 201A returns to the original shape, the cross section of the first insertion portion 212 has a portion OV1 (hatched portion) overlapping the first body portion 201.

That is, the cross section of the first insertion portion 212 at the axial position where the width of the first insertion portion 212 is maximum has a portion OV1 overlapping the tubular body 20 when viewed in the axial direction. Thus, the first insertion portion 212 can be prevented from coming off the tubular body 20.

In a state where at least a part of the first wall surface portion W1 is disposed in the first circumferential notch 201B1, the top rib 212A4 is disposed between the circumferential end surfaces 201A3 of the first end side notch 201A and between the circumferential end surfaces 201C1 of the first center side notch 201C. As a result, the rotation of the first conductor 21V1 with respect to the tubular body 20 is restricted.

Figure 21:
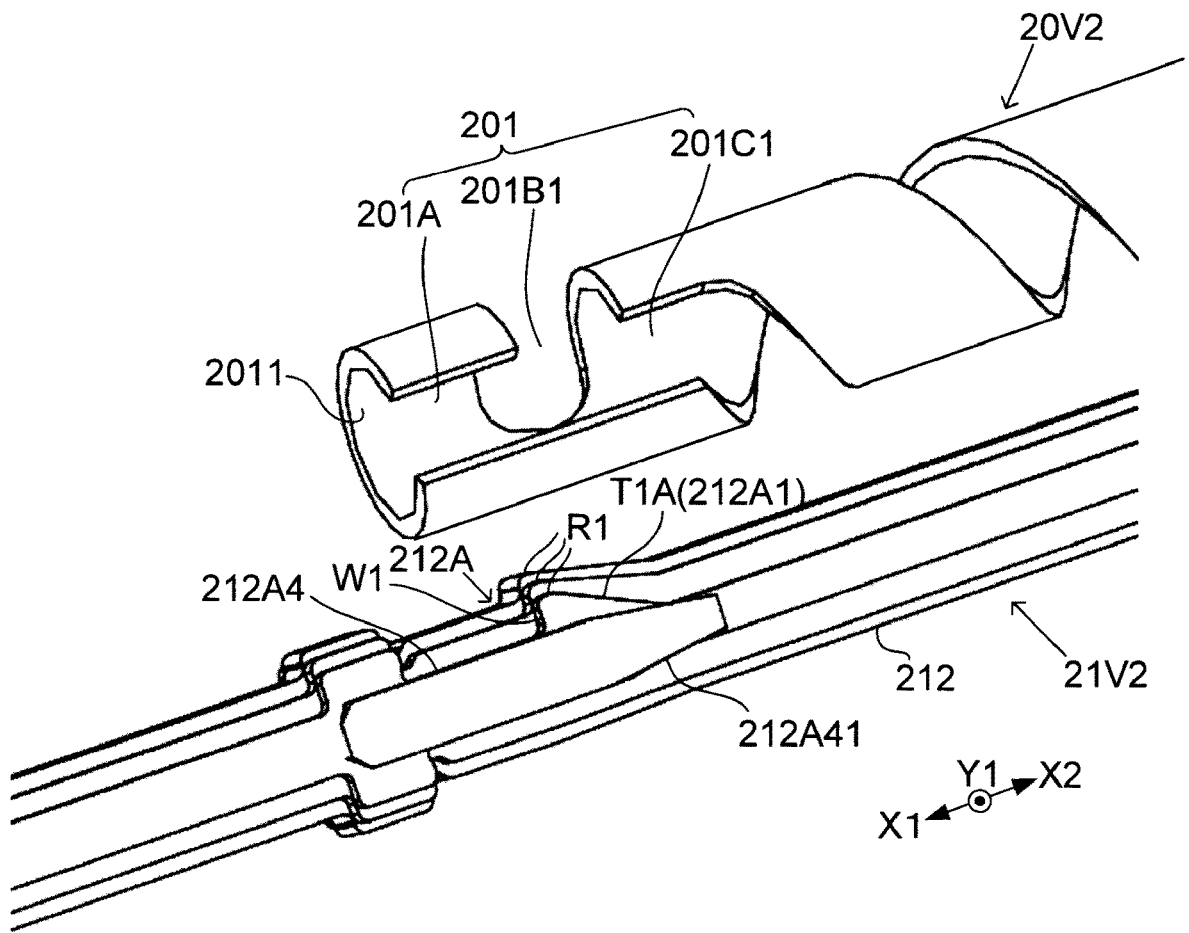
FIG. 21 is an enlarged view of a main part illustrating the snap-fit structure in the contact terminal according to a second modification.

FIG. 21 is a diagram mainly illustrating the first conductor 21V2 and the tubular body 20V2 in the contact terminal according to a second modification. As illustrated in FIG. 21, the first body portion 201 of the tubular body 20V2 in the second modification has only the first circumferential notch 201B1 as the circumferential notch. Correspondingly, the snap-fit portion 212A of the first conductor 21V2 has the first inclined portion 212A1, the round portion R1, and the first wall surface portion W1 only on one side with respect to the central axis J when viewed from the direction perpendicular to the axial direction.

Figure 22A:
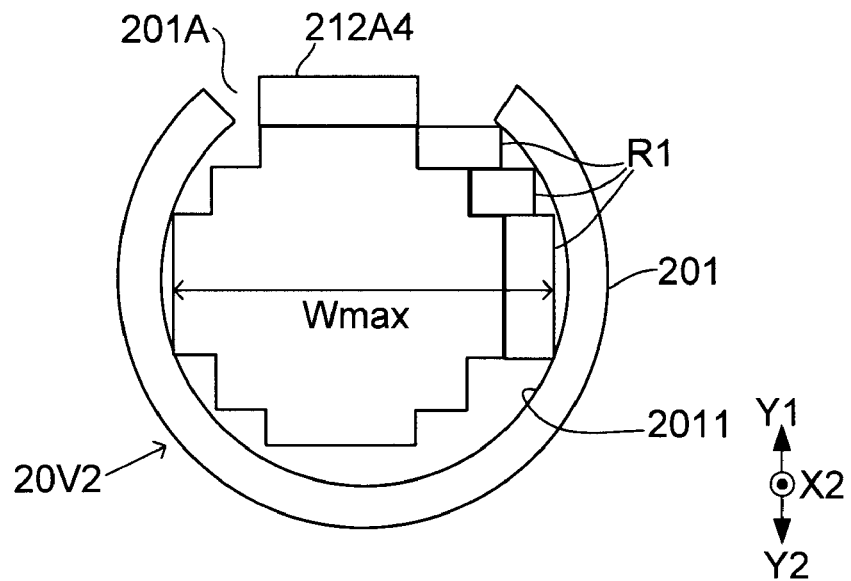
FIG. 22A is an axial sectional view illustrating a state in which the round portion is in contact with the inner peripheral surface of the tubular body in the assembly of the contact terminal according to the second modification.
Figure 22B:
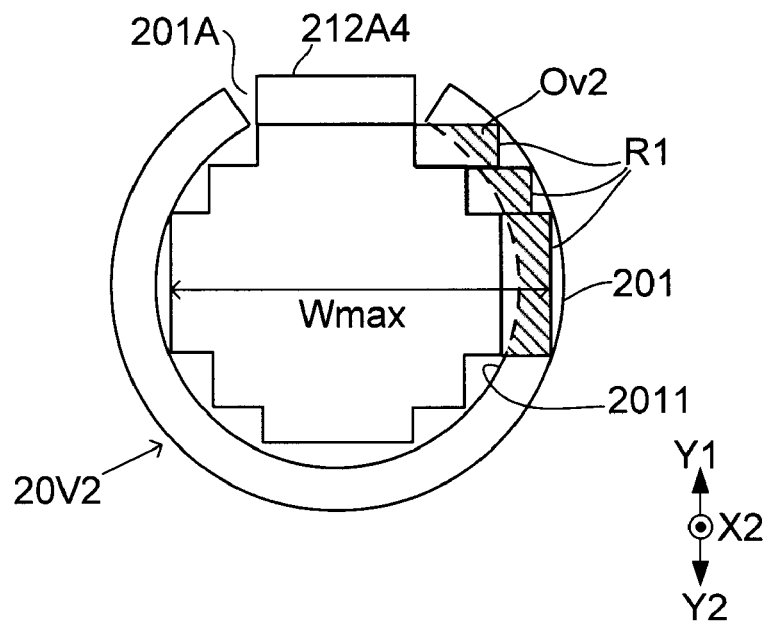
FIG. 22B is an axial sectional view illustrating a state in which the round portion is accommodated in the circumferential notch of the tubular body in the assembly of the contact terminal according to the second modification.

When the first conductor 21V2 according to the second modification is fixed to the tubular body 20V2, the tip portion 212A41 of the top rib 212A4 is inserted into the first end side notch 201A, and the first conductor 21V2 is pushed into the other axial direction X2 side. Then, the first end side notch 201A expands due to the contact between the round portion R1 and the inner peripheral surface 201I of the first body portion 201. FIG. 22A illustrates a cross section as viewed in the axial direction in this state. FIG. 22A and FIG. 22B described later correspond to FIG. 20A and FIG. 20B described above, respectively.

Then, when the first conductor 21V2 is further pushed toward the other axial direction X2 side, the first end side notch 201A returns to its original shape. A cross section in this state as viewed in the axial direction is illustrated in FIG. 22B. As illustrated in FIG. 22B, the cross section of the first insertion portion 212 at the axial position where the width of the first insertion portion 212 is maximum has a portion Ov2 (hatched portion) overlapping the tubular body 20V2 as viewed in the axial direction. This makes it possible to suppress the first insertion portion 212 from coming off the tubular body 20V2.

Figure 23:
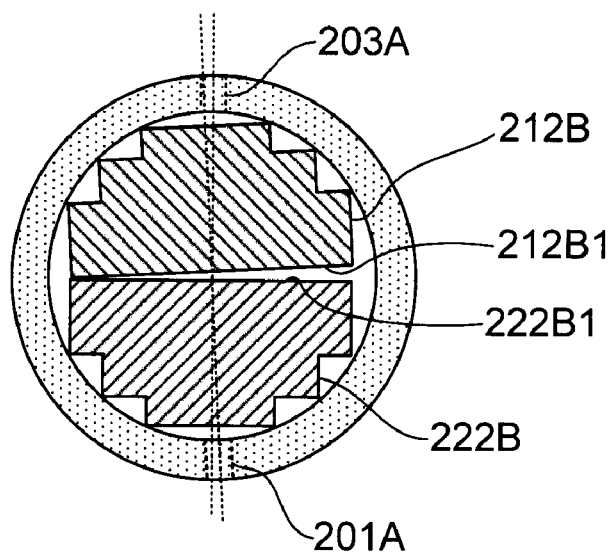
FIG. 23 is a sectional view, as viewed in the axial direction, illustrating a modification of the contact between the first contact portion and the second contact portion.

The positions of the notches 201A, 201B1, 201B2, and 201C on the one axial direction X1 side of the tubular body 20 may be shifted from the positions 180° apart from the notches on the other axial direction X2 side of the tubular body 20 about the central axis J. An example of this case is illustrated in FIG. 23. FIG. 23 is a sectional view of a place where the first contact portion 212B and the second contact portion 222B are in contact with each other as viewed in the axial direction. Note that FIG. 23 illustrates the second end side notch 203A at the other axial end portion 20B of the tubular body 20 corresponding to the first end side notch 201A.

As illustrated in FIG. 23, the first flat surface 212B1 is disposed to be inclined with respect to the second flat surface 222B1 as viewed in the axial direction by setting the position where the first conductor 21 is fixed to the tubular body 20 by snap-fitting to a position shifted from the position 180° apart from the position where the second conductor 22 is fixed to the tubular body 20 by snap-fitting about the central axis J. Accordingly, by positively bringing the first flat surface 212B1 into contact with the second flat surface 222B1, it is possible to suppress a contact failure between the first flat surface 212B1 and the second flat surface 222B1. In addition, a clearance for sliding can be provided between the first flat surface 212B1 and the second flat surface 222B1.

While the embodiments of the present disclosure have been described above, the embodiments can be modified in various ways within the scope of the present disclosure.

For example, a method of manufacturing a conductor provided with a contact portion having a flat surface is not limited to the MEMS technology, and for example, a method in which cutting processing using a lathe and cutting processing using a milling machine are combined may be used.

Various embodiments of the present disclosure are applicable to electrical inspections for various inspection targets.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A contact terminal, comprising:
a tubular body extending in an axial direction of the contact terminal; and
a bar-shaped first conductor and a bar-shaped second conductor having conductivity,
wherein the first conductor includes:
a first protrusion that protrudes from the tubular body toward one side in the axial direction; and
a first insertion portion disposed inside an outer periphery of the tubular body and fixed to one end portion of the tubular body in the axial direction,
the second conductor includes a second insertion portion that is disposed inside an outer periphery of the tubular body and is fixed to the other end portion of the tubular body in the axial direction,
the tubular body includes a spring portion formed in a spiral shape along a peripheral surface of the tubular body,
the first insertion portion includes a first contact portion having a first flat surface along the axial direction,
the second insertion portion includes a second contact portion having a second flat surface along the axial direction,
the first flat surface and the second flat surface are in contact with each other,
the tubular body includes at least a first end side notch provided along the axial direction on a peripheral surface of the one end portion of the tubular body in the axial direction,
the first insertion portion includes a first end side rib disposed between circumferential end surfaces of the first end side notch.

2. The contact terminal according to claim 1, wherein a first chamfered portion or a first round portion that is away from the second flat surface from a contact position between the first flat surface and the second flat surface toward the other side in the axial direction is provided at the other end portion in the axial direction of the first contact portion.

3. The contact terminal according to claim 2, wherein a cross section of the first contact portion as viewed in the axial direction and a cross section of the second contact portion as viewed in the axial direction have substantially the same shape on a surface where the first flat surface and the second flat surface are in contact with each other.

4. The contact terminal according to claim 2, wherein the first contact portion and the second contact portion have a laminated configuration in which a direction perpendicular to the axial direction is a laminating direction.

5. The contact terminal according to claim 2, wherein a first flat surface is disposed to be inclined with respect to a second flat surface as viewed in the axial direction.

6. The contact terminal according to claim 2, wherein the first flat surface and the second flat surface are in contact with each other in a natural state of the spring portion.

7. The contact terminal according to claim 1, wherein a cross section of the first contact portion as viewed in the axial direction and a cross section of the second contact portion as viewed in the axial direction have substantially the same shape on a surface where the first flat surface and the second flat surface are in contact with each other.

8. The contact terminal according to claim 7, wherein the first contact portion and the second contact portion have a laminated configuration in which a direction perpendicular to the axial direction is a laminating direction.

9. The contact terminal according to claim 7, wherein a first flat surface is disposed to be inclined with respect to a second flat surface as viewed in the axial direction.

10. The contact terminal according to claim 7, wherein the first flat surface and the second flat surface are in contact with each other in a natural state of the spring portion.

11. The contact terminal according to claim 1, wherein the first contact portion and the second contact portion have a laminated configuration in which a direction perpendicular to the axial direction is a laminating direction.

12. The contact terminal according to claim 11, wherein the first flat surface and the second flat surface are flat surfaces perpendicular to the laminating direction.

13. The contact terminal according to claim 12, wherein a first flat surface is disposed to be inclined with respect to a second flat surface as viewed in the axial direction.

14. The contact terminal according to claim 11, wherein the first flat surface and the second flat surface are flat surfaces along the laminating direction.

15. The contact terminal according to claim 14, wherein a first flat surface is disposed to be inclined with respect to a second flat surface as viewed in the axial direction.

16. The contact terminal according to claim 11, wherein a first flat surface is disposed to be inclined with respect to a second flat surface as viewed in the axial direction.

17. The contact terminal according to claim 1, wherein a first flat surface is disposed to be inclined with respect to a second flat surface as viewed in the axial direction.

18. The contact terminal according to claim 1, wherein the first flat surface and the second flat surface are in contact with each other in a natural state of the spring portion.

19. An inspection jig comprising:
a plurality of the contact terminals, each contact terminal comprising:
a tubular body extending in an axial direction of the contact terminal; and
a bar-shaped first conductor and a bar-shaped second conductor having conductivity,
wherein the first conductor includes:
a first protrusion that protrudes from the tubular body toward one side in the axial direction; and
a first insertion portion disposed inside an outer periphery of the tubular body and fixed to one end portion of the tubular body in the axial direction,
the second conductor includes a second insertion portion that is disposed inside an outer periphery of the tubular body and is fixed to the other end portion of the tubular body in the axial direction, the tubular body includes a spring portion formed in a spiral shape along a peripheral surface of the tubular body, the first insertion portion includes a first contact portion having a first flat surface along the axial direction, the second insertion portion includes a second contact portion having a second flat surface along the axial direction, the first flat surface and the second flat surface are in contact with each other, the tubular body includes at least one a first end side notch provided along the axial direction on a peripheral surface of the one end portion of the tubular body in the axial direction, the first insertion portion includes a first end side rib disposed between circumferential end surfaces of the first end side notch;

and a support member that supports the plurality of the contact terminals.

20. An inspection device comprising:

an inspection jig comprising:

a plurality of the contact terminals, each contact terminal comprising:

a tubular body extending in an axial direction of the contact terminal; and a bar-shaped first conductor and a bar-shaped second conductor having conductivity, wherein the first conductor includes:

a first protrusion that protrudes from the tubular body toward one side in the axial direction; and a first insertion portion disposed inside an outer periphery of the tubular body and fixed to one end portion of the tubular body in the axial direction, the second conductor includes a second insertion portion that is disposed inside an outer periphery of the tubular body and is fixed to the other end portion of the tubular body in the axial direction, the tubular body includes a spring portion formed in a spiral shape along a peripheral surface of the tubular body, the first insertion portion includes a first contact portion having a first flat surface along the axial direction, the second insertion portion includes a second contact portion having a second flat surface along the axial direction, the first flat surface and the second flat surface are in contact with each other, the tubular body includes at least a first end side notch provided along the axial direction on a peripheral surface of the one end portion of the tubular body in the axial direction, the first insertion portion includes a first end side rib disposed between circumferential end surfaces of the first end side notch, and;

and a support member that supports the plurality of the contact terminals; and an inspection processing unit that performs inspection of an inspection target on a basis of an electrical signal obtained by bringing the contact terminal into contact with an inspection point provided on the inspection target.

* * * * *